(12) United States Patent
Yamazaki et al.

(10) Patent No.: US 12,049,167 B2
(45) Date of Patent: *Jul. 30, 2024

(54) VEHICLE ALARM DEVICE

(71) Applicant: SEMICONDUCTOR ENERGY LABORATORY CO., LTD., Atsugi (JP)

(72) Inventors: Shunpei Yamazaki, Tokyo (JP); Takayuki Ikeda, Kanagawa (JP); Kiyotaka Kimura, Kanagawa (JP); Yuki Tamatsukuri, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 542 days.

This patent is subject to a terminal disclaimer.

(21) Appl. No.: 17/275,847

(22) PCT Filed: Oct. 2, 2019

(86) PCT No.: PCT/IB2019/058362
§ 371 (c)(1),
(2) Date: Mar. 12, 2021

(87) PCT Pub. No.: WO2020/075008
PCT Pub. Date: Apr. 16, 2020

(65) Prior Publication Data
US 2022/0041101 A1    Feb. 10, 2022

(30) Foreign Application Priority Data

Oct. 11, 2018   (JP) ................................ 2018-192450

(51) Int. Cl.
*H04R 3/00*       (2006.01)
*B60Q 5/00*       (2006.01)
(Continued)

(52) U.S. Cl.
CPC .............. *B60Q 5/005* (2013.01); *G01S 5/183* (2013.01); *G01S 5/22* (2013.01); *G05B 13/027* (2013.01);
(Continued)

(58) Field of Classification Search
CPC ..... H04R 3/002; H04R 2499/13; H04R 1/406
(Continued)

(56) References Cited

U.S. PATENT DOCUMENTS 8,897,049 B2    11/2014   Furutani
9,107,012 B2 *   8/2015   Lord .................... H04R 29/005
(Continued)

FOREIGN PATENT DOCUMENTS

CN          107161098 A       9/2017
CN          108454621 A       8/2018
(Continued)

OTHER PUBLICATIONS

International Search Report (Application No. PCT/IB2019/058362) Dated Dec. 24, 2019.
(Continued)

*Primary Examiner* — Disler Paul
(74) *Attorney, Agent, or Firm* — Fish & Richardson P.C.

(57) ABSTRACT

A vehicle alarm device (200) having a novel structure is provided. The vehicle alarm device (200) includes a sound-source detection device (110), and the sound-source detection device (110) includes a plurality of microphones (116) and a delay circuit (117). As a transistor included in a signal retention circuit (22) inside the delay circuit (117), a transistor including an oxide semiconductor (OS transistor) is used. By the sound-source detection device (110), an extraneous sound is obtained and the sound-source position of the extraneous sound is identified. In the case where it is judged from the relative velocity or the like between the sound
(Continued)

source whose position has been identified and the vehicle that the sound source and the vehicle are likely to collide, an acoustic signal for calling attention of the vehicle occupant is output.

6 Claims, 26 Drawing Sheets

(51) Int. Cl.
*G01S 5/18* (2006.01)
*G01S 5/22* (2006.01)
*G05B 13/02* (2006.01)
*H01L 27/12* (2006.01)
*H01L 29/786* (2006.01)
*H04R 1/40* (2006.01)
*H10B 12/00* (2023.01)

(52) U.S. Cl.
CPC ...... *H01L 27/1207* (2013.01); *H01L 27/1225* (2013.01); *H01L 27/124* (2013.01); *H01L 27/1255* (2013.01); *H01L 29/7869* (2013.01); *H04R 1/406* (2013.01); *H10B 12/00* (2023.02); *H04R 2499/13* (2013.01)

(58) Field of Classification Search
USPC .................................. 381/56–57, 92, 86, 389
See application file for complete search history.

(56) References Cited

U.S. PATENT DOCUMENTS

| | | | |
|---|---|---|---|
| 9,438,234 B2 | 9/2016 | Maehashi et al. | |
| 9,507,346 B1 | 11/2016 | Levinson et al. | |
| 9,606,539 B1 | 3/2017 | Kentley et al. | |
| 9,733,346 B1 | 8/2017 | Jang et al. | |
| 9,742,356 B2 | 8/2017 | Takahashi et al. | |
| 9,804,599 B2 | 10/2017 | Kentley-Klay et al. | |
| 9,878,664 B2 | 1/2018 | Kentley-Klay et al. | |
| 10,048,683 B2 | 8/2018 | Levinson et al. | |
| 10,248,119 B2 | 4/2019 | Kentley-Klay et al. | |
| 10,264,350 B2 | 4/2019 | Kanamori et al. | |
| 10,496,766 B2 | 12/2019 | Levinson et al. | |
| 10,543,838 B2 | 1/2020 | Kentley-Klay et al. | |
| 10,560,056 B2 | 2/2020 | Takahashi et al. | |
| 10,747,231 B2* | 8/2020 | Akotkar | G10L 25/30 |
| 10,832,502 B2 | 11/2020 | Levinson et al. | |
| 11,167,812 B2 | 11/2021 | Kentley-Klay | |
| 11,283,877 B2 | 3/2022 | Kentley-Klay et al. | |
| 11,500,388 B2 | 11/2022 | Kentley-Klay et al. | |
| 11,796,998 B2 | 10/2023 | Kentley-Klay et al. | |
| 2012/0287693 A1 | 11/2012 | Furutani | |
| 2013/0271220 A1 | 10/2013 | Takahashi et al. | |
| 2014/0185846 A1 | 7/2014 | Gran et al. | |
| 2014/0185847 A1 | 7/2014 | Gran et al. | |
| 2016/0149573 A1 | 5/2016 | Maehashi et al. | |
| 2018/0102741 A1 | 4/2018 | Takahashi et al. | |
| 2018/0255395 A1 | 9/2018 | Kanamori et al. | |
| 2020/0177132 A1 | 6/2020 | Takahashi et al. | |
| 2022/0089063 A1* | 3/2022 | Fields | B60R 21/01554 |

FOREIGN PATENT DOCUMENTS

| | | |
|---|---|---|
| CN | 108540898 A | 9/2018 |
| DE | 102013206284 | 10/2013 |
| EP | 3370232 A | 9/2018 |
| JP | 05-085288 A | 4/1993 |
| JP | 08-254995 A | 10/1996 |
| JP | 2012-256409 A | 12/2012 |
| JP | 2013-235564 A | 11/2013 |
| JP | 2016-105590 A | 6/2016 |
| JP | 2016-219028 A | 12/2016 |
| JP | 2017-107141 A | 6/2017 |
| JP | 2018-092668 A | 6/2018 |
| JP | 2018-146948 A | 9/2018 |
| KR | 2012-0127296 A | 11/2012 |
| KR | 2013-0115131 A | 10/2013 |
| WO | WO-2017/079236 | 5/2017 |

OTHER PUBLICATIONS

Written Opinion (Application No. PCT/IB2019/058362) Dated Dec. 24, 2019.

Chinese Office Action (Application No. 201980065650.5) Dated Dec. 26, 2023.

* cited by examiner

200

110[k]

110[k]

$a = x_1 w_1 + x_2 w_2 + b$

VEHICLE ALARM DEVICE

CROSS REFERENCE TO RELATED APPLICATIONS

This application is a U.S. National Phase Application under 35 U.S.C. § 371 of International Application PCT/IB2019/058362, filed on Oct. 2, 2019, which is incorporated by reference and claims the benefit of a foreign priority application filed in Japan on Oct. 11, 2018, as Application No. 2018-192450.

TECHNICAL FIELD

One embodiment of the present invention relates to vehicle alarm devices. Another embodiment of the present invention relates to an operation method of these.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter.

BACKGROUND ART

Vehicles such as automobiles are one of essential transportation or physical distribution means in modern society. In recent years, many companies are developing techniques for recognizing the surrounding environment of vehicles with the use of sensors such as LIDAR (Light Detection And Ranging), a millimeter wave radar, and a camera. Patent Document 1 discloses a method of detecting an obstacle located in an invisible range by a sound-source localization technology using microphones.

REFERENCE

Patent Document

[Patent Document 1] Japanese Published Patent Application No. H5-85288

SUMMARY OF THE INVENTION

Problems to be Solved by the Invention

An object of one embodiment of the present invention is to provide a novel vehicle alarm device or the like. Another object is to provide a vehicle alarm device or the like with improved operation speed. Another object is to provide a vehicle alarm device or the like capable of precise operation even under high temperature environments.

Note that the description of these objects does not preclude the existence of other objects. One embodiment of the present invention does not have to achieve all of these objects. Objects other than these are apparent from and can be derived from the description of the specification, the drawings, the claims, and the like.

Means for Solving the Problems

Another embodiment of the present invention is a vehicle alarm device including a sound-source detection device, and the sound-source detection device includes a plurality of microphones and a delay circuit. As a transistor included in the delay circuit, a transistor including an oxide semiconductor, which is a kind of a metal oxide, in a semiconductor layer where a channel is formed (also referred to as an "OS transistor") is used. By the sound-source detection device, an extraneous sound is obtained and the sound-source position of the extraneous sound is identified. In the case where it is judged from the relative velocity or the like between the sound source whose position has been identified and the vehicle that the sound source and the vehicle are likely to collide, an acoustic signal for calling attention of the vehicle occupant is output.

Another embodiment of the present invention is a vehicle alarm device which includes a sound-source detection device, a control device, and a signal output device and is incorporated in a vehicle. The sound-source detection device has a function of obtaining an extraneous sound and a function of identifying a sound-source position of the extraneous sound. The control device has a function of obtaining a change of the sound-source position and a function of supplying a signal to the signal output device. The signal output device has a function of receiving the signal and outputting an acoustic signal.

Another embodiment of the present invention is a vehicle alarm device which includes a sound-source detection device, a control device, and a signal output device and is incorporated in a vehicle. The sound-source detection device has a function of obtaining an extraneous sound and a function of identifying a sound-source position of the extraneous sound. The control device has a function of obtaining a change of the sound-source position and a function of supplying a signal to the signal output device. The signal output device has a function of receiving the signal and outputting an acoustic signal. The sound-source detection device includes a microphone array including a first microphone and a second microphone, a first selection circuit, a first signal retention circuit, a second signal retention circuit, a second selection circuit, and a signal processing circuit. The first selection circuit has a function of selecting the first microphone or the second microphone. The first signal retention circuit has a function of retaining sound-source signals obtained at a plurality of timings with the first microphone as a plurality of first voltages corresponding to the respective sound-source signals. The second signal retention circuit has a function of retaining sound-source signals obtained at a plurality of timings with the second microphone as a plurality of second voltages corresponding to the respective sound-source signals. The second selection circuit has a function of selecting any one of the plurality of first voltages and any one of the plurality of second voltages. The signal processing circuit has a function of performing an operation with the first voltage and the second voltage which are selected by the second selection circuit. The first signal retention circuit and the second signal retention circuit each include a first transistor. A semiconductor layer of the first transistor includes an oxide semiconductor.

The acoustic signal is preferably a signal which calls attention of a vehicle occupant. As long as calling attention of the vehicle occupant is possible, the output of the signal output device is not necessarily the acoustic signal. For example, it may be a luminous signal, a smell, a vibration, or the like.

The control device has a function of obtaining the change of the sound-source position with the sound-source position and a relative velocity between the sound-source position and a vehicle.

The signal processing circuit may be a differential circuit and/or a multiplier circuit.

Note that one embodiment of the present invention can be applied to every mobile objects without limitation to vehicles such as automobiles and busses. For example, it can be applied to various mobile objects such as railroad vehicles such as trains and locomotives, civil engineering vehicles such as crane trucks and bulldozers, manned robots, aircraft such as airplanes and helicopters, ships, and submarines.

Effect of the Invention

With one embodiment of the present invention, a novel vehicle alarm device or the like can be provided. Alternatively, a vehicle alarm device or the like with improved operation speed can be provided. Alternatively, a vehicle alarm device or the like capable of precise operation even under high temperature environments can be provided.

Note that the description of these effects does not preclude the existence of other effects. One embodiment of the present invention does not need to have all of these effects. Effects other than these are apparent from and can be derived from the description of the specification, the drawings, the claims, and the like.

MODE FOR CARRYING OUT THE INVENTION

Figure 1A:
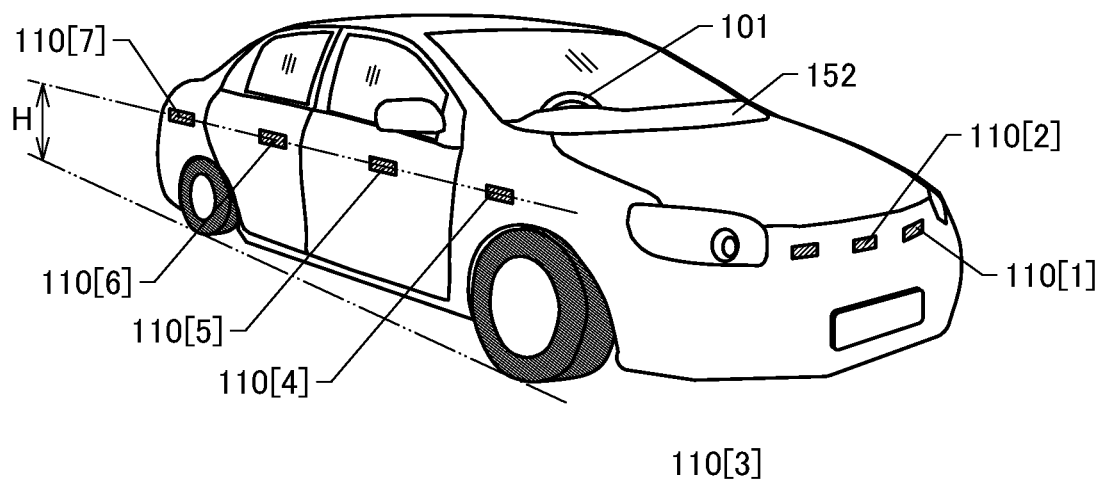
FIG. 1A and FIG. 1B are views illustrating a vehicle.

Embodiments of the present invention are described in detail below with reference to the drawings. Note that the present invention is not limited to the following description, and it is readily understood by those skilled in the art that modes and details of the present invention can be modified in various ways. In addition, the present invention should not be construed as being limited to the description of the embodiments below.

Note that in each drawing described in this specification, the size, the layer thickness, or the region of each component are exaggerated or omitted for clarification of the invention in some cases. Therefore, they are not limited to the illustrated scale. In a top view (also referred to as a "plan view"), a perspective view, or the like, some components might be omitted for easy understanding of the drawings. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

In the case where there is an explicit description, X and Y are connected, in this specification and the like, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than the one shown in drawings or texts is also disclosed in the drawings or the texts.

In this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Furthermore, the terms "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

Note that in this specification and the like, the terms "identical", "the same", "equal", "uniform", or the like (including synonyms thereof) used in describing calculation values and measurement values contain an error of ±20% unless otherwise specified.

In this specification and the like, a high power supply potential VDD (hereinafter also simply referred to as "VDD" or an "H potential") is a power supply potential higher than a low power supply potential VSS. The low power supply potential VSS (hereinafter also simply referred to as "VSS" or an "L potential") is a power supply potential lower than the high power supply potential VDD. In addition, a ground potential can be used as VDD or VSS. For example, in the case where VDD is a ground potential, VSS is a potential lower than the ground potential, and in the case where VSS is a ground potential, VDD is a potential higher than the ground potential.

Note that the term "film" and the term "layer" can be interchanged with each other depending on the case or circumstances. For example, the term "conductive layer" can be changed into the term "conductive film" in some cases. As another example, the term "insulating film" can be changed into the term "insulating layer" in some cases.

Embodiment 1

Figure 1B:
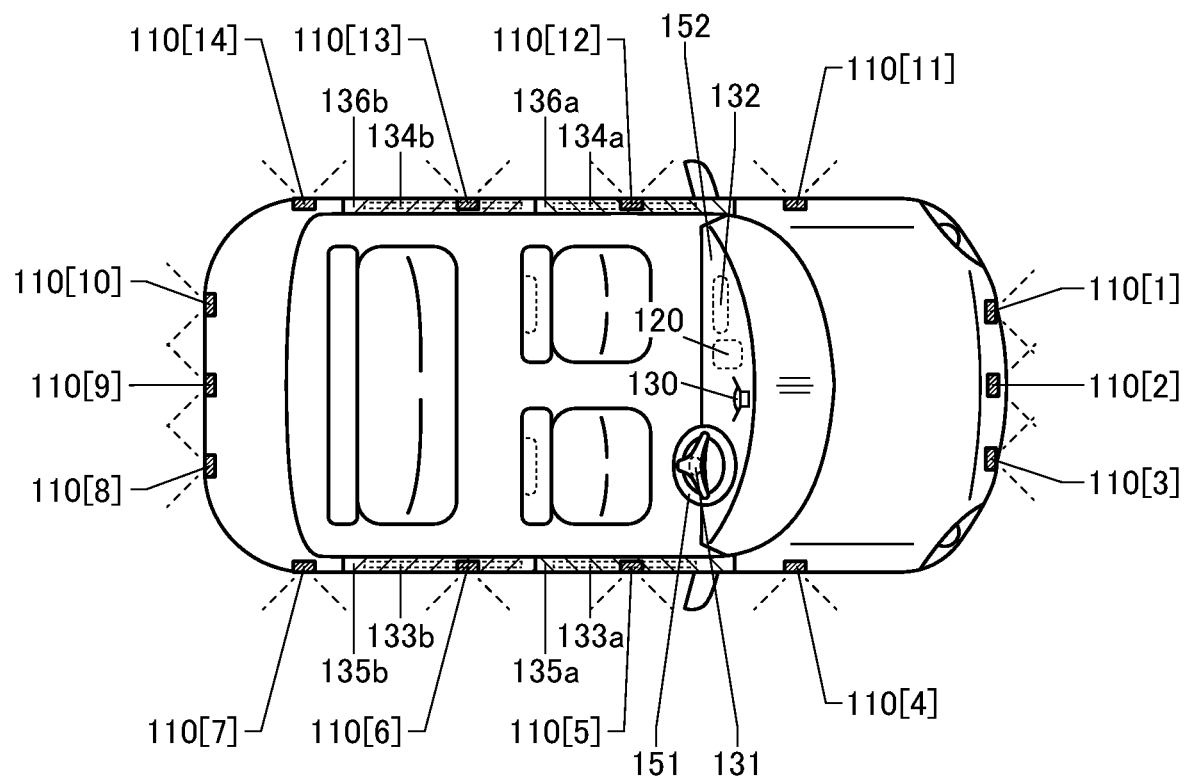
Figure 2A:
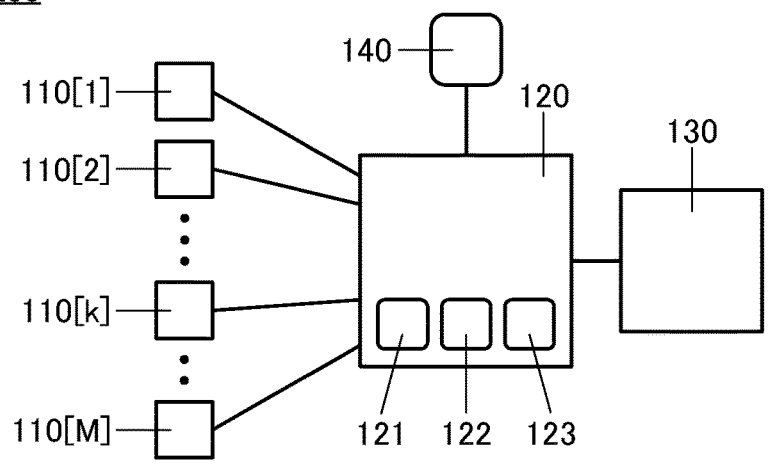
FIG. 2A, FIG. 2B, and FIG. 2C are block diagrams illustrating structure examples of a vehicle alarm device and a sound-source detection device.

A vehicle alarm device of one embodiment of the present invention will be described with reference to the drawings. FIG. 1A is a perspective view illustrating appearance of a vehicle 100 including a vehicle alarm device 200. FIG. 1B is a top view of the vehicle 100. Note that some components of the vehicle 100 are not illustrated in FIG. 1B and the like for easy understanding of the drawings. Furthermore, FIG. 2A shows a block diagram illustrating a structure example of the vehicle alarm device 200.

Structure Example of Vehicle 100 and Vehicle Alarm Device 200

The vehicle 100 illustrated in FIG. 1A and FIG. 1B includes M (M is an integer greater than or equal to 1) sound-source detection devices 110. In this specification and the like, the first sound-source detection device 110 is denoted by the sound-source detection device 110[1], and the k-th (k is an integer greater than or equal to 1 and less than or equal to M) sound-source detection device 110 is denoted by the sound-source detection device 110[k]. Similarly, the M-th sound-source detection device 110 is denoted by the sound-source detection device 110[M].

Note that in this specification and the like, arbitrary one of the sound-source detection devices 110[1] to 110[M] is denoted by "the sound-source detection device 110[k]" or "the sound-source detection device 110". The same applies to the reference numerals denoting the other constituent elements. To distinguish the plurality of elements, expressions such as [1] or _1 are used.

FIG. 1A and FIG. 1B illustrate fourteen sound-source detection devices 110 (the sound-source detection devices 110[1] to 110[11]). Specifically, the sound-source detection device 110[1] to the sound-source detection device 110[3] are included in the front part of the vehicle 100; the sound-source detection device 110[4] to the sound-source detection device 110[7] are included on a right side surface; the sound-source detection device 110[8] to the sound-source detection device 110[10] are included at the back; and the sound-source detection device 110[11] to the sound-source detection device 110[14] are included on a left side surface. Note that the number of sound-source detection devices 110 provided in the vehicle 100 is not limited to fourteen. Furthermore, by using more sound-source detection devices 110, the accuracy of detecting the position, velocity, or the like of an object that approaches the vehicle 100 can be further increased.

Moreover, the vehicle 100 includes an air bag device 131 in a steering 151 and an air bag device 132 in a dashboard 152. Furthermore, an air bag device 133a is included in a door 135a, and an air bag device 133b is included in a door 135b. In addition, an air bag device 134a is included in a door 136a, and an air bag device 134b is included in a door 136b. Moreover, the vehicle 100 includes a control device 120 and a signal output device 130.

The vehicle alarm device 200 includes the sound-source detection devices 110, the control device 120, and the signal output device 130. Specifically, the M sound-source detection devices 110 and the signal output device 130 are connected to the control device 120 (see FIG. 2A).

The control device 120 may include a memory device 121, an arithmetic device 122, a neural network 123, and the like. The arithmetic device 122 may be a GPU (Graphics Processing Unit). Furthermore, the control device 120 or the arithmetic device 122 may be formed with a PLD (Programmable Logic Device) such as an FPGA (Field Programmable Gate Array) or an FPAA (Field Programmable Analog Array).

Note that the sound-source detection devices 110 and the signal output device 130 may be connected to the control device 120 through a wired connection or wireless connection. The wired connection in which they are directly connected with a metal wire or the like is less influenced by noise than the wireless connection in which they are connected by radio communication or the like. Instead of the metal wire, an optical fiber or the like may be used. In contrast, when using the wireless connection, the number of wires used for the connection can be reduced. Moreover, the degree of flexibility in installing the sound-source detection devices 110 and the signal output device 130 can be increased. Thus, the vehicle alarm device 200 can be installed easily.

Furthermore, a sensor 140 other than the sound-source detection devices 110 may be connected to the control device 120 (see FIG. 2A). Examples of the sensor 140 include an electromagnetic wave sensor, an ultrasonic sensor, an infrared sensor, an acceleration sensor, an image sensor, a millimeter wave radar, a lidar, and the like. A plurality of kinds of sensors 140 may be connected to the control device 120.

The sound-source detection device 110[1] to the sound-source detection device 110[3] have a function of detecting a sound source mainly ahead of the vehicle 100. Furthermore, the sound-source detection device 110[4] to the sound-source detection device 110[7] have a function of detecting a sound source mainly on the right side of the vehicle 100. Furthermore, the sound-source detection device 110[8] to the sound-source detection device 110[10] have a function of detecting a sound source mainly behind the vehicle 100. Moreover, the sound-source detection device 110[11] to the sound-source detection device 110[14] have a function of detecting a sound source mainly on the left side of the vehicle 100.

Preferably, the installation height H of the sound-source detection device 110 (the height from a road surface to the sound-source detection device 110) is greater than or equal to 50 cm, preferably greater than or equal to 1 m, further preferably greater than or equal to 1 m 50 cm from the road surface. When the installation position of the sound-source detection device 110 is close to the road surface, the device tends to be influenced by acoustic reflection or the like by the road surface, whereby the detection accuracy might be lowered.

Furthermore, the installation heights H of the M sound-source detection devices 110 from the ground are preferably equal to each other. In particular, the installation heights H of the sound-source detection device 110[1] to the sound-source detection device 110[3] are preferably equal to each other. Moreover, the installation heights H of the sound-source detection device 110[4] to the sound-source detection device 110[7] are preferably equal to each other. Moreover, the installation heights H of the sound-source detection device 110[8] to the sound-source detection device 110[10] are preferably equal to each other. Furthermore, the installation heights H of the sound-source detection device 110[11] to the sound-source detection device 110[14] are preferably equal to each other.

Specifically, the installation height H of each of the M sound-source detection devices 110 is preferably greater than or equal to 0.8 times and less than or equal to 1.2 times the average installation height H value, and further preferably greater than or equal to 0.9 times and less than or equal to 1.1 times the average installation height H value.

Figure 2B:
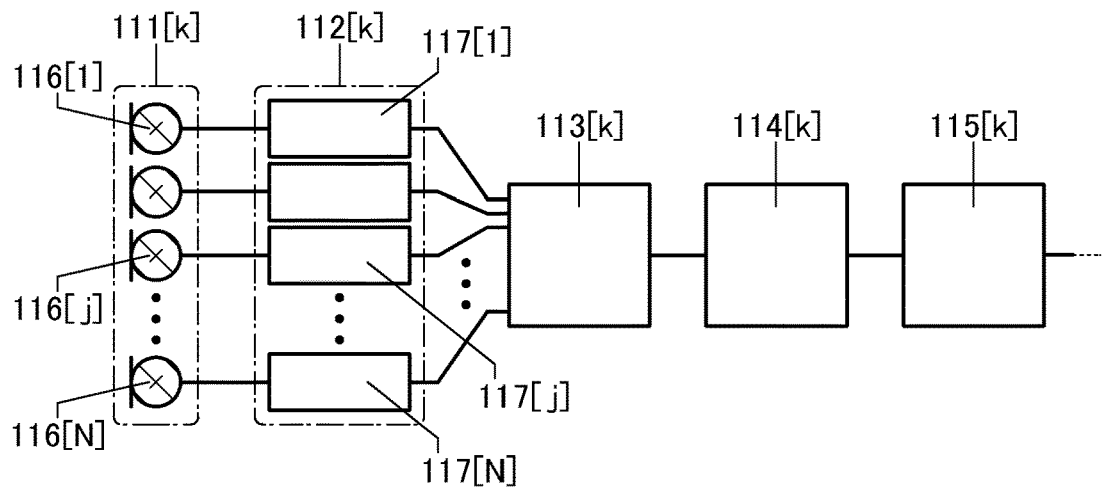

FIG. 2B is a block diagram illustrating a structure of the sound-source detection device 110[k]. The sound-source detection device 110[k] includes a microphone array 111[k], a delay circuit group 112[k], a signal processing circuit 113[k], an ADC 114[k], and a digital arithmetic circuit 115[k].

The microphone array 111[k] includes N (N is an integer greater than or equal to 2) microphones 116. The microphones 116 have a function of converting captured sound waves into electric signals (also referred to as "sound-source signals").

The delay circuit group 112[k] includes N delay circuits 117. The j-th (j is an integer greater than or equal to 1 and less than or equal to N) microphone 116 (the microphone 116[j]) is electrically connected to the j-th delay circuit 117 (the delay circuit 117[j]). The N delay circuits 117 are electrically connected to the signal processing circuit 113[k], and the signal processing circuit 113[k] is electrically connected to the digital arithmetic circuit 115[k]. Note that the sound-source detection device 110 will be described in detail later.

Figure 2C:
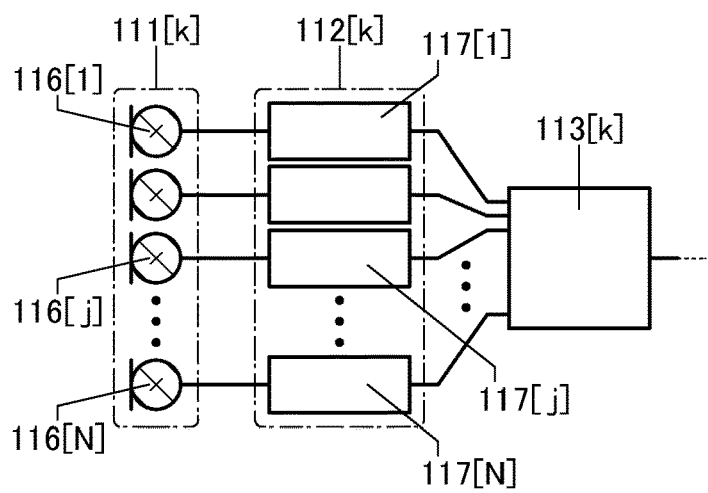

The ADC 114[k] has a function of converting an analog signal into a digital signal. If the output of the signal processing circuit 113[k] is a digital signal, the ADC 114 is not necessarily provided. Furthermore, the structure of the sound-source detection device 110[k] can be simplified by making the control device 120 take charge of the functions of the ADC 114[k] and/or the digital arithmetic circuit 115[k], for example (see FIG. 2C).

Because an analog signal is weak to noise, if the output of the signal processing circuit 113[k] is an analog signal, the ADC 114[k] is preferably provided as close to the signal processing circuit 113[k] as possible.

In the case where the ADC 114 is provided in the sound-source detection device 110, if the number of sound-source directions which are desired to be recognized individually is eight for example, one sound-source detection device 110 may be provided with eight ADCs 114. Providing the plurality of ADCs 114 can increase the processing capability of the sound-source detection device 110.

Operation Example of Vehicle Alarm Device 200

Figure 3:
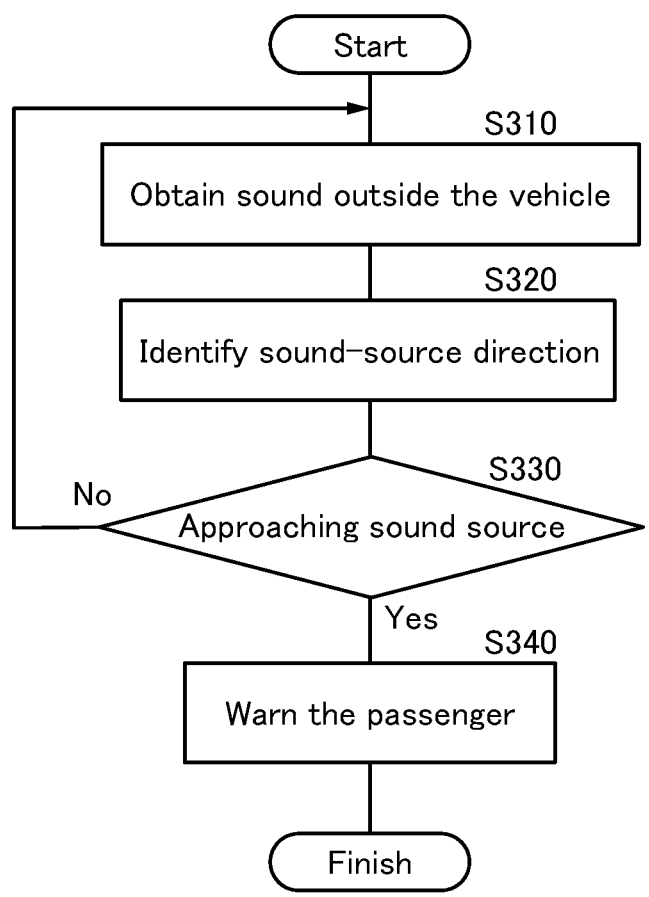
FIG. 3 is a flowchart showing an operation of a vehicle alarm device.
Figure 4:
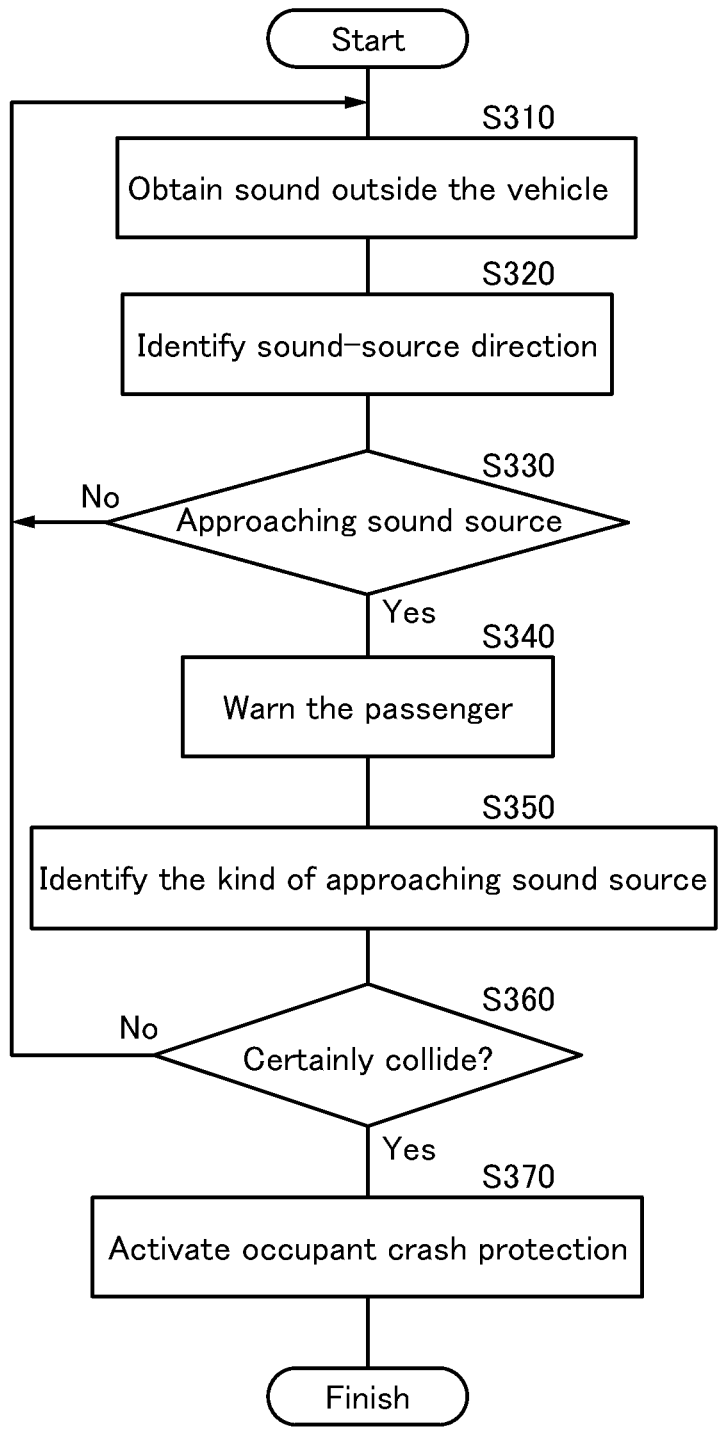
FIG. 4 is a flowchart showing an operation of a vehicle alarm device.

Next, an operation example of the vehicle alarm device 200 will be described with reference to the drawings. FIG. 3 and FIG. 4 are flowcharts showing operations of the vehicle alarm device 200. FIG. 5 to FIG. 9 are views illustrating an operation of the vehicle alarm device 200.

Operation Example 1

Figure 5:
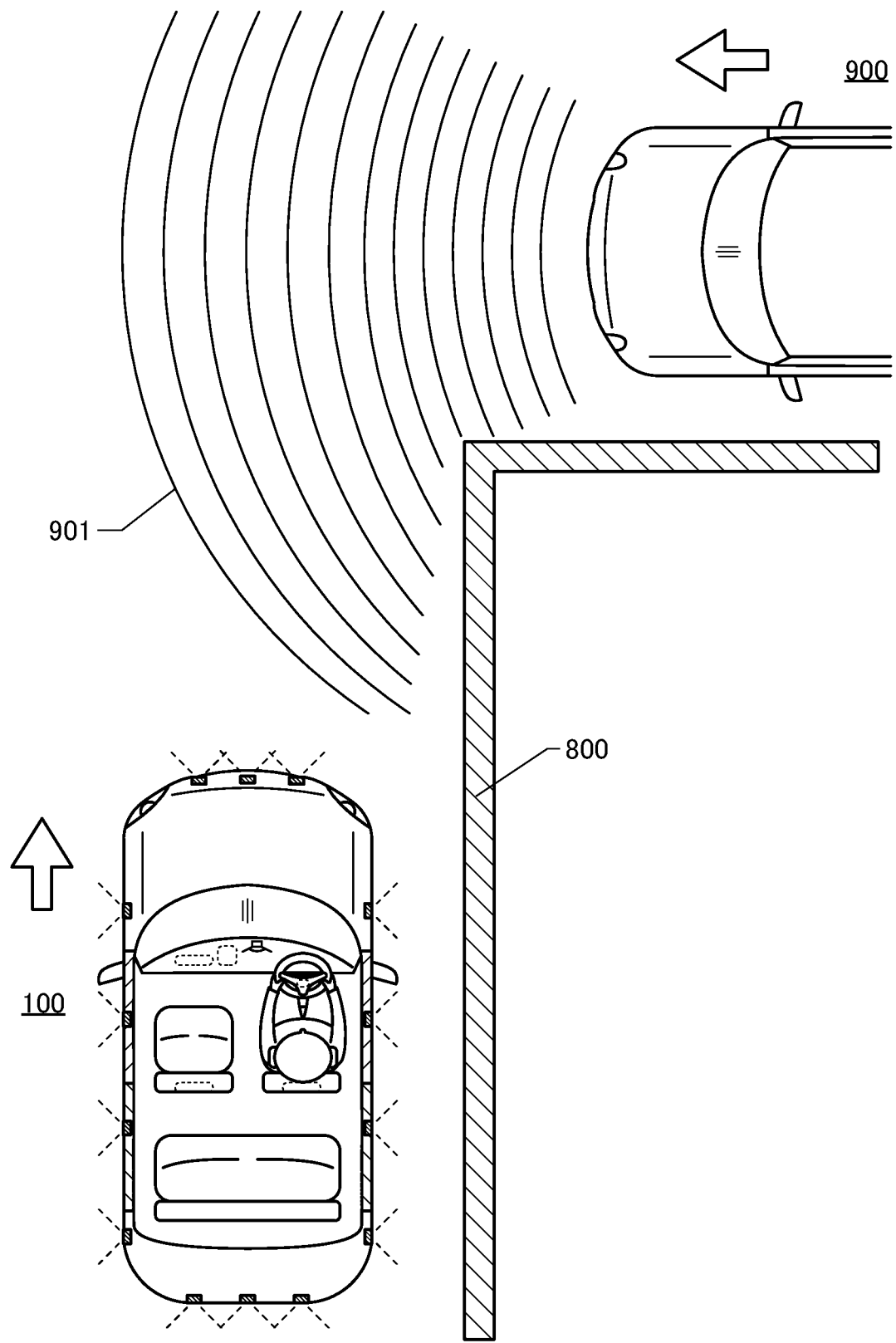
FIG. 5 is a view illustrating an operation of a vehicle alarm device.
Figure 6:
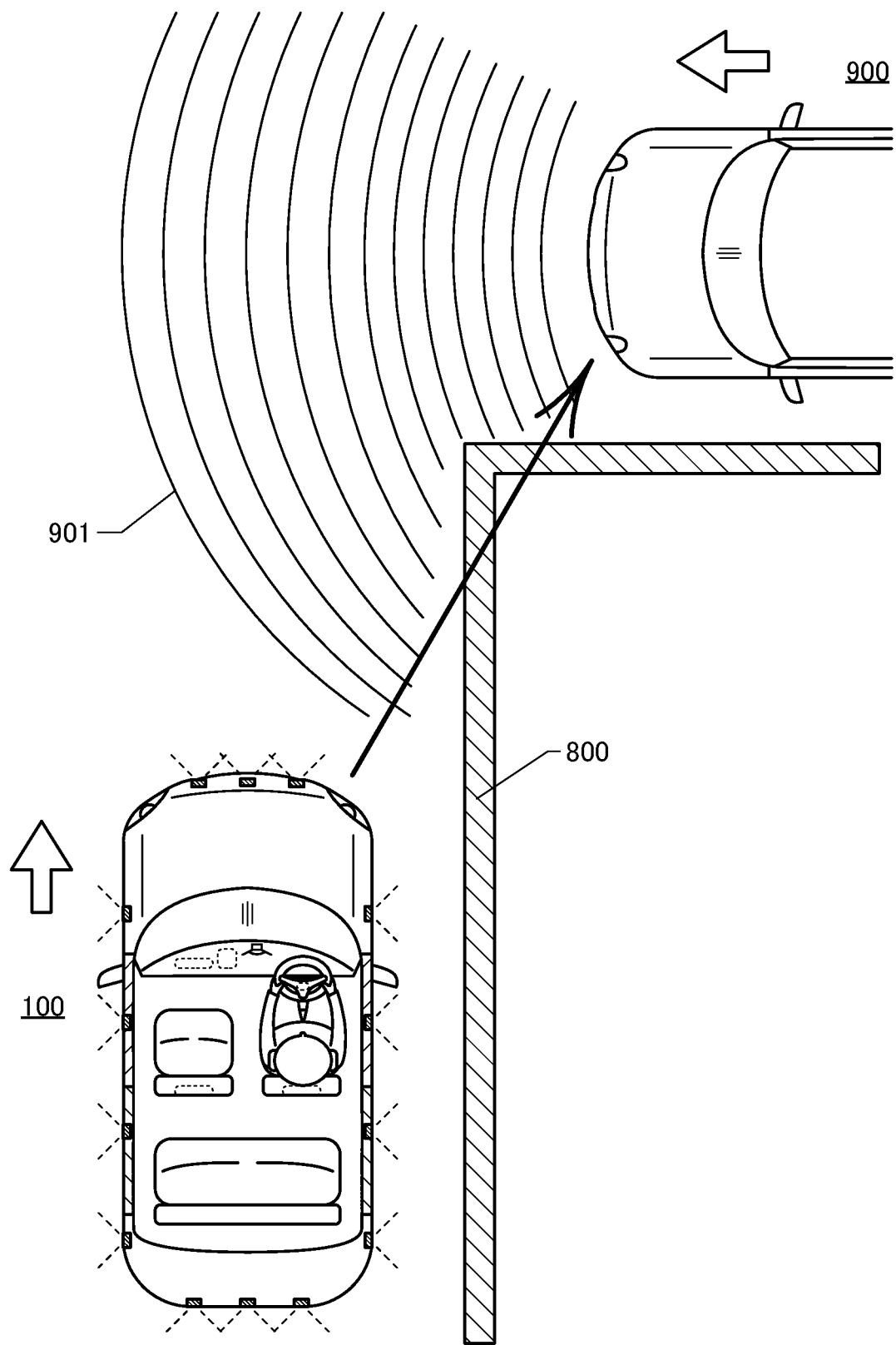
FIG. 6 is a view illustrating an operation of a vehicle alarm device.
Figure 7:
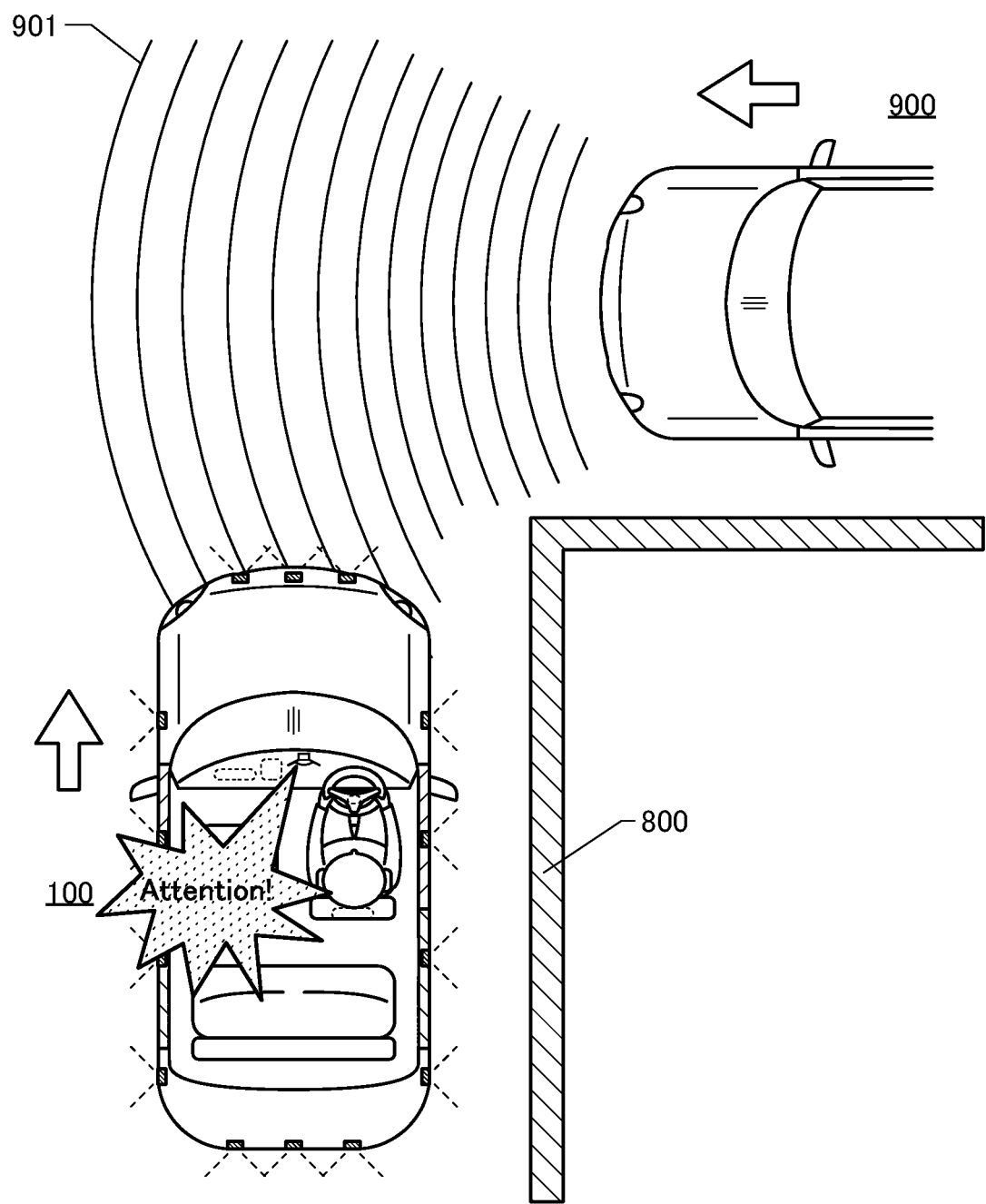
FIG. 7 is a view illustrating an operation of a vehicle alarm device.
Figure 8:
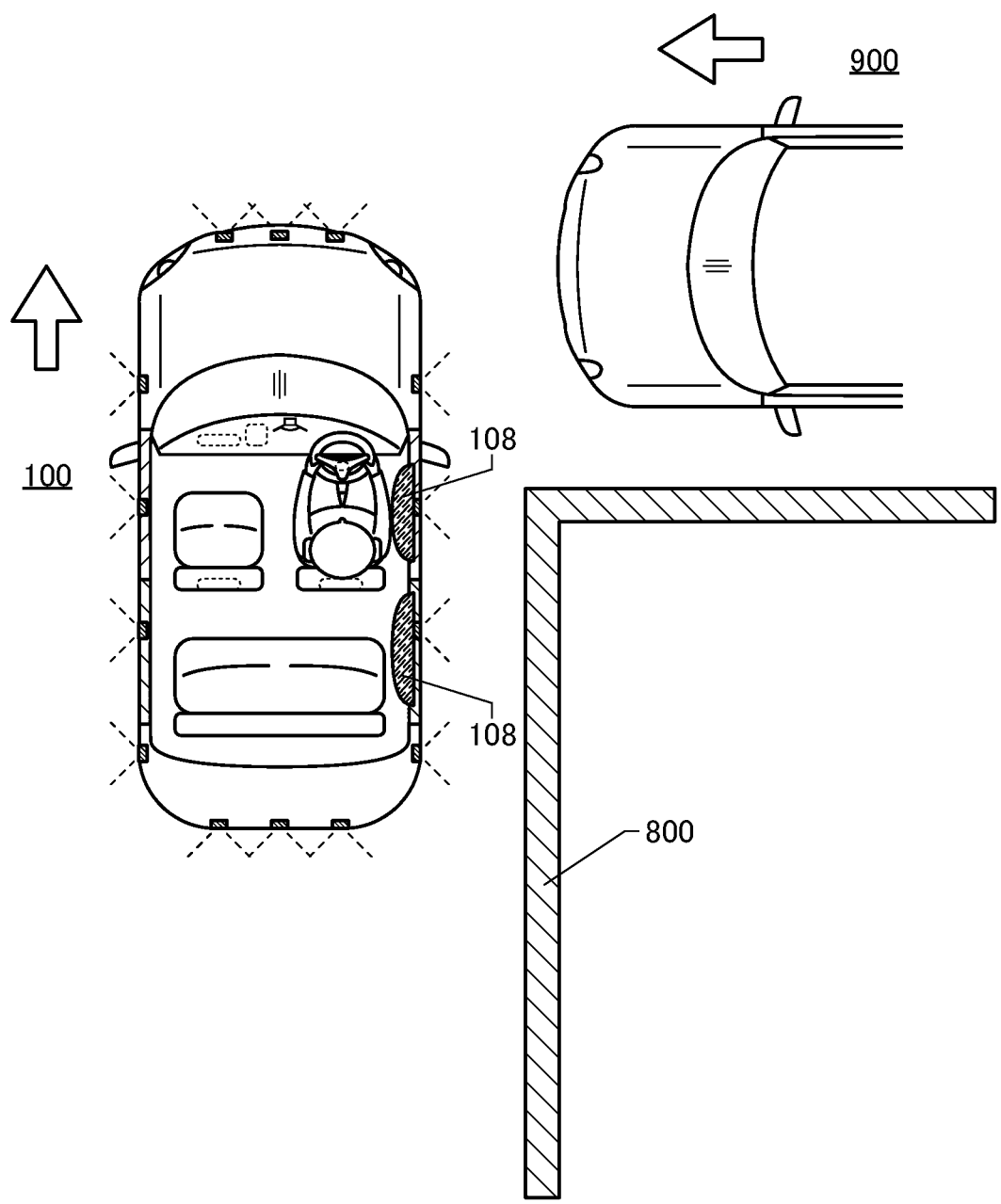
FIG. 8 is a view illustrating an operation of a vehicle alarm device.
Figure 9:
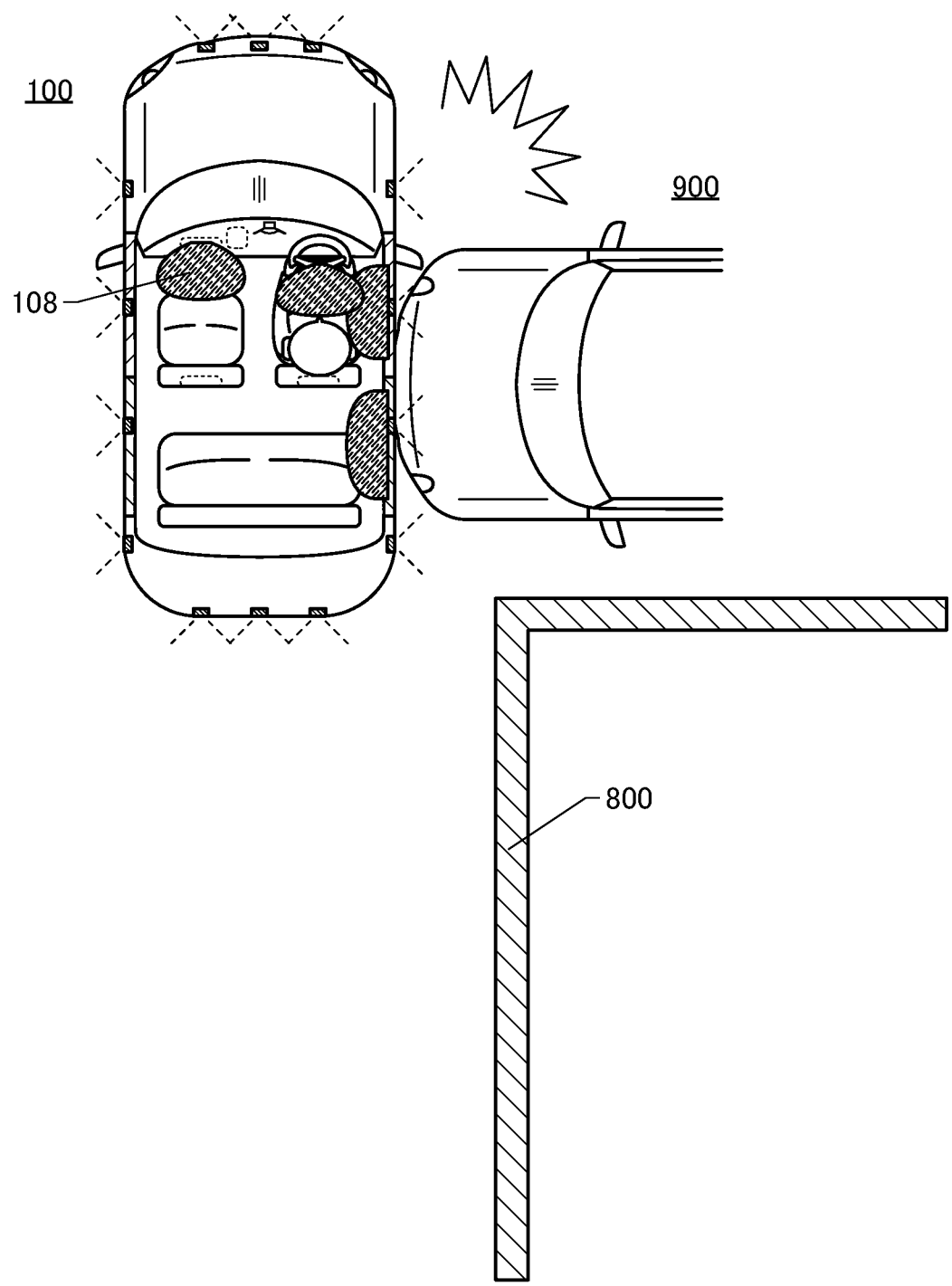
FIG. 9 is a view illustrating an operation of a vehicle alarm device.

A flowchart showing an operation example of the vehicle alarm device 200 is shown in FIG. 3. First, a sound outside the vehicle 100 (also referred to as "an extraneous sound") is obtained (Step S310). FIG. 5 illustrates a state where the vehicle 100 obtains an extraneous sound 901 emanating from a vehicle 900 which moves behind a wall-shaped structure 800. The vehicle 900 is blocked from view by the structure 800 and cannot be visually recognized from the vehicle 100.

Next, the sound-source position of the extraneous sound 901 is identified (Step S320. See FIG. 6.). The method for identifying the sound-source position will be described in detail later.

Then, in the control device 120, whether the sound source whose position has been identified is approaching the vehicle 100 is judged from the sound-source position and the relative velocity between the sound source and the vehicle 100 (Step S330).

In the case where it is judged from a change in the sound-source position that the sound source is at risk of colliding with the vehicle 100, the control device 120 supplies a signal to the signal output device 130 provided in the vehicle. On the reception of the signal supplied from the control device 120, the signal output device 130 outputs an acoustic signal such as a warning sound for calling attention of the vehicle occupant (Step S340. See FIG. 7.). The output of a warning sound from the signal output device 130 enables the vehicle occupant to take evasive action to avoid a collision. Note that an audio system, a navigation system, or the like incorporated in the vehicle 100 may be used as the signal output device 130.

Furthermore, the output of the signal output device 130 is not limited to the acoustic signal and may be a luminous signal. Alternatively, a smell, a vibration, or the like may be output in order to call attention of the vehicle occupant.

The position of the sound source may be identified with one sound-source detection device 110 or with a plurality of sound-source detection devices 110. By increasing the number of sound-source detection devices 110 used for identifying the position of the sound source, the accuracy of identifying the position of the sound source can be increased.

Operation Example 2

A flowchart showing an operation different from that of the operation example 1 is shown in FIG. 4. FIG. 4 is a flowchart showing an operation example for the case where an occupant crash protection (e.g., an air bag device) is used in conjunction with the vehicle alarm device 200.

The operation up to Step S340 of the operation example 2 is similar to that of the operation example 1. Then, the digital arithmetic circuit 115[k] and/or the control device 120 analyzes the sound source approaching the vehicle 100 and identifies the approaching object (the vehicle 900 in this embodiment) from the kind of sound (Step S350). For example, noise components such as an engine sound, a brake sound, and a noise of moving car can be identified by a data processing method such as template matching and excluded. Furthermore, whether the object (hereinafter also referred to as "approaching object") is a truck, an automobile, or a motorcycle can be identified, for example. In the case where the approaching object is equipped with an ultrasonic collision avoidance system, an ultrasonic wave emanating from the approaching object can be utilized to identify the approaching object.

The data processing such as the identification of the kind of an approaching object or the removal of a noise component may be performed using an artificial intelligence (AI) technology such as machine learning.

For example, the memory device 121 included in the control device 120 may store weight data obtained in advance by leaning, acoustic data, or the like so that the kind of the approaching object can be identified by the neural network 123 using the weight data or the acoustic data. Furthermore, the neural network 123 may be software and the arithmetic device 122 may perform an operation so that the kind of the approaching object can be identified.

With the artificial intelligence technology, noise components such as an engine sound, a brake sound, a noise of moving car, and other ambient sounds can be removed. The use of the artificial intelligence technology enables identification of an approaching object out of various noise components.

Figure 10A:
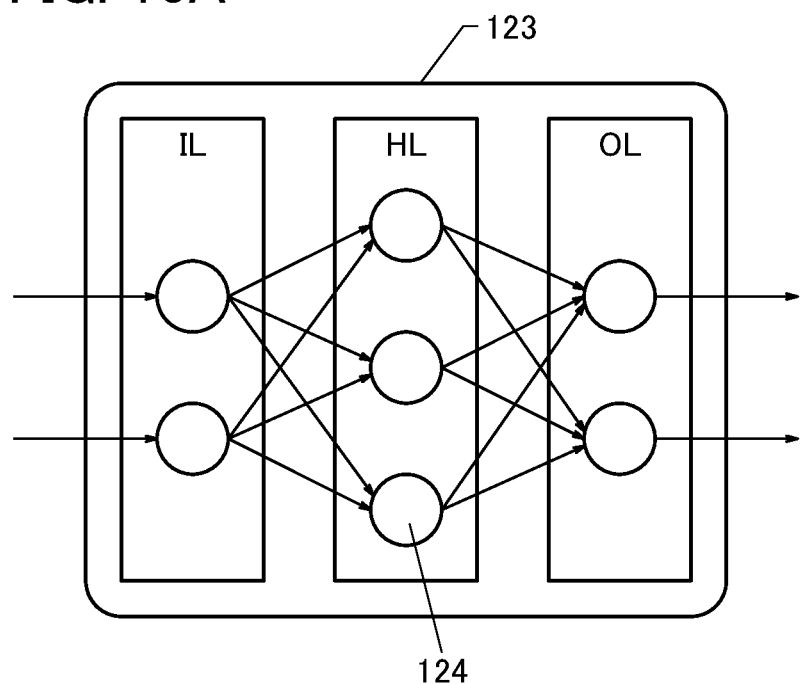
FIG. 10A and FIG. 10B are views illustrating a structure example of a neural network.

Here, a structure example of the neural network 123 is described. As shown in FIG. 10A, the neural network 123 can be formed of an input layer IL, an output layer OL, and a middle layer (hidden layer) HL. The input layer IL, the output layer OL, and the middle layer HL each include one or more neurons (neurons 124). Note that the middle layer HL may be composed of one layer or two or more layers. A neural network including two or more middle layers HL can also be referred to as a DNN (deep neural network), and learning using a deep neural network can also be referred to as deep learning.

Input data is input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 10B:
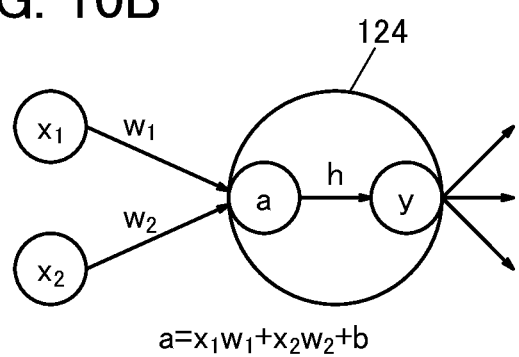

FIG. 10B shows an example of an operation with the neurons. Here, the neuron 124 and two neurons in the previous layer which output signals to the neuron 124 are illustrated. An output $x_1$ of a neuron in the previous layer and an output $x_2$ of a neuron in the previous layer are input to the neuron 124. Then, in the neuron 124, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal $y=h(a)$ is output from the neuron 124.

In this manner, the operation with the neurons includes the operation that sums the products of the outputs and the weights of the neurons in the previous layer, that is, the product-sum operation ($x_1w_1+x_2w_2$ described above). This product-sum operation may be performed using a program on software or using hardware. In the case where the product-sum operation is performed by hardware, a product-sum operation circuit can be used. Either a digital circuit or an analog circuit can be used as this product-sum operation circuit. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit may be formed using a transistor including silicon (such as single crystal silicon) in a semiconductor layer where a channel is formed (also referred to as "Si transistor") or an OS transistor. An OS transistor is particularly suitable as a transistor included in an analog memory of the product-sum operation circuit because of its extremely low off-state current. Note that the product-sum operation circuit may include both a Si transistor and an OS transistor.

Then, the control device 120 estimates whether the collision between the approaching object and the vehicle 100 is certain, from a change in the distance and relative velocity between the approaching object and the vehicle 100 (Step S360). In addition, the control device 120 estimates the impact strength of the collision from the kind of the approaching object and the relative velocity. At this time, by taking data obtained from the sensor 140 into consideration, the impact strength can be estimated more accurately.

In the case where it is judged that the collision is unlikely, the process goes back to Step S310. In the case where it is judged that the collision is certain, an occupant crash protection is activated (Step S370). For example, in the case where an air bag device is used as the occupant crash protection, all the air bag devices incorporated in the vehicle 100 may be activated at the same time; alternatively, the collision point of the vehicle 100 may be estimated and the air bag device to be activated may be determined.

For example, in the case where the collision of the vehicle 100 on the right side surface is certain, the air bag device 133a and the air bag device 133b are operated to inflate an air bag 108. At this time, the air bag 108 may be inflated by a mechanical method such as a pump before collision (see FIG. 8.) and the air bag may be rapidly inflated by an inflator after collision (see FIG. 9.).

The ultimate pressure inside the air bag 108 is determined depending on the impact strength of the collision estimated previously. The appropriate control of the pressure inside the air bag enables optimal protection of the occupant. Furthermore, the impact right after the collision may be detected with an acceleration sensor or the like, and then the pressure inside the air bag may be further adjusted. The air bag device can protect the occupant without delay by being activated before collision.

Moreover, the air bag device may be provided with a plurality of inflators and the inflators may be operated sequentially, for example, so that the pressure, the inflation speed, and the like of the air bag can be adjusted. In the case where the air bag device is provided with a plurality of inflators, the inflators may each have the same explosive power or may have different explosive powers.

In the case where a plurality of inflators are provided in an air bag device, the usage amount of gunpowder per inflator can be reduced, whereby the possibility of the secondary disaster due to the operation of the air bag device can be lowered. In addition, the sound of an explosion in the inflator's operation can be reduced, which leads to reduction of the occupant's psychological burden, for example.

Furthermore, in the case where the plurality of inflators are incorporated in the air bag device, even when a problem occurs in one of the inflators, the air bag device can be certainly operated by the other inflators. Thus, the redundancy of the air bag device can be increased. In other words, the redundancy of the occupant crash protection can be increased.

Furthermore, when the above-described method of inflating the air bag by a mechanical method such as a pump before collision is used, the air bag can be stored and used again in the case where collision is avoided at the last minute or where the collision is unserious and the inflator does not need to be operated. Also in the air bag device incorporating a plurality of inflators, in the case where an inflator that has not been used yet is left after the operation of the air bag device, the air bag can be stored and used again. This eliminates the need for replacing the air bag device, reducing the maintenance cost of the vehicle 100.

This embodiment can be implemented in combination with the structures described in the other embodiments as appropriate.

Embodiment 2

Figure 11A:
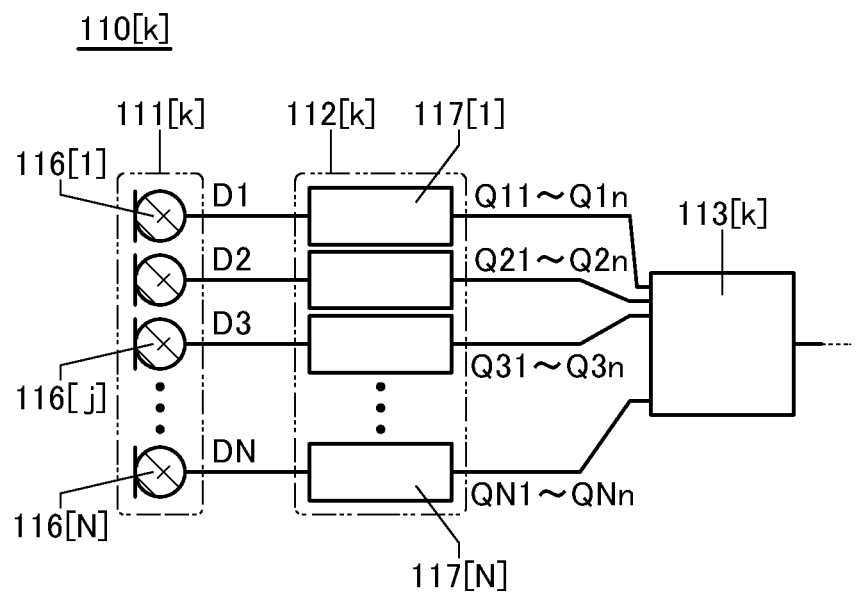
FIG. 11A and FIG. 11B are block diagrams illustrating a structure example of a sound-source detection device.

In this embodiment, a structure and an operation of the sound-source detection device 110 described in the above embodiment will be described in detail with reference to the drawings. FIG. 11A is a block diagram illustrating a structure example of the sound-source detection device 110[$k$] described in the above embodiment. Note that FIG. 11A is a block diagram equivalent to FIG. 2C. Thus, portions different from those described in the above embodiment will be mainly described so that repetition of the description can be reduced.

The sound-source detection device 110[$k$] of one embodiment of the present invention includes the microphone array 111[$k$] having a plurality of microphones, and has a function of a sound-source localization device that can focus on a target direction by adding delay to the sound which enters each microphone so that the sound from the target direction is in phase. A difference of the distance between a sound source and a microphone leads to a time-of-flight (ToF) difference of sound waves, which allows the sound-source position to be estimated.

In FIG. 11A, sound-source signals converted by the microphones 116 are shown as sound-source signals D1 to DN. The sound-source signal D1 is supplied to the delay circuit 117[1], and the sound-source signal DN is supplied to the delay circuit 117[N]. In other words, the sound-source signals D1 to DN are supplied to the corresponding delay circuits 117[1] to 117[N].

Furthermore, an amplifier circuit may be provided between each microphone 116 and each delay circuit 117. Provision of the amplifier circuit between each microphone 116 and each delay circuit 117 allows the increase of the distance between the microphone array 111[$k$] and the delay circuit group 112[$k$].

Figure 11B:
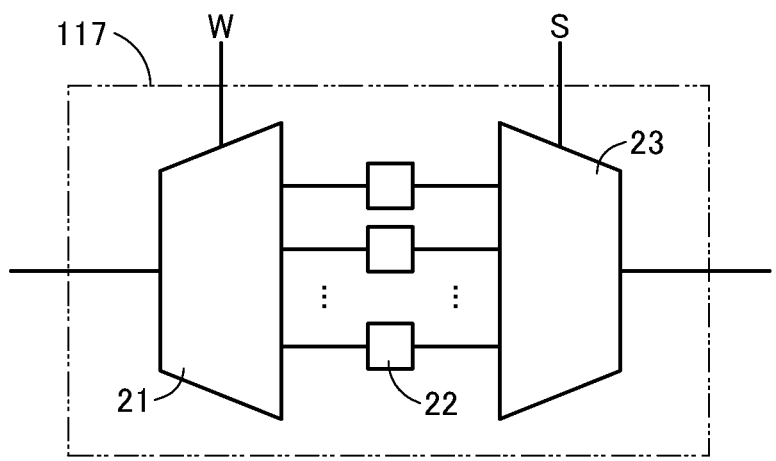

The delay circuits 117 (the delay circuit 117[1] to the delay circuit 117[N]) have a function of delaying the sound-source signals supplied from the microphones 116 and generating output signals. FIG. 11B shows a block diagram illustrating a structure of one delay circuit 117. The delay circuits 117 each include a selection circuit 21, a plurality of signal retention circuits 22, and a selection circuit 23.

The selection circuit 21 (also referred to as a first selection circuit) has a function of a demultiplexer, which splits one of the sound-source signals D1 to DN, such as the sound-source signal D1, into the plurality of signal retention circuits 22. The selection circuit 21 has a function of a switch, whose on or off is controlled by a selection signal W. The selection circuit 21 is composed of n-channel transistors, for example. In this case, an H-level selection signal W turns on the transistors included in the selection circuit 21, and an L-level selection signal W turns off the transistors included in the selection circuit 21.

The plurality of signal retention circuits 22 have a function of retaining analog voltages corresponding to the sound-source signal and outputting voltages corresponding to the analog voltages. The analog voltages are written to the signal retention circuits 22 by turning the switch of the selection circuit 21 on at a predetermined timing and sampling the sound-source signal. Writing the analog voltages to the signal retention circuits 22 can be controlled by setting the selection signal W to the H level. Retaining the analog voltages in the signal retention circuits 22 can be controlled by setting the selection signal W to the L level.

The analog voltages, which are based on the sound-source signal at the time when the selection signal W is set to the H level, are written to the plurality of signal retention circuits 22 at different timings, and the analog voltages are retained by setting the selection signal W to the L level. In other words, the plurality of signal retention circuits 22 can obtain the sound-source signal from the microphone 116 at different timings and retain voltages corresponding to the sound-source signal. The plurality of signal retention circuits 22 consecutively sample the sound-source signal, whereby discrete values of the sound-source signal output from the microphone 116 can be retained.

The plurality of signal retention circuits 22 also have a function of amplifying and outputting the retained analog voltages. For example, the plurality of signal retention circuits 22 each include a source-follower circuit, and have a function of outputting a voltage corresponding to the retained analog voltage through the source-follower circuit or the like.

The selection circuit 23 (also referred to as a second selection circuit) has a function of a multiplexer, which selects one of the analog voltages retained in the plurality of signal retention circuits 22 and outputs it at a different timing. The selection circuit 23 has a function of a switch, whose on or off is controlled by a selection signal S. The selection circuit 23 is composed of n-channel transistors, for example. In this case, the H-level selection signal S turns on the transistors included in the selection circuit 23, and the L-level selection signal S turns off the transistors included in the selection circuit 23.

The selection circuit 23 is provided in each of the delay circuits 117[1] to 117[N], and output signals Q11-Q1$n$ to QN1-QN$n$ can be obtained. The output signals Q11-Q1$n$ are signals corresponding to the sound-source signal D1, which are discrete signals obtained by consecutively outputting the analog voltages retained in the plurality of signal retention circuits 22 included in the delay circuit 117[1]. This output signals Q11-Q1$n$ correspond to the sound-source signal D1 delayed by a certain period of time. The output signals Q21-Q2$n$ to QN1-QN$n$ are also signals corresponding to the sound-source signals D2 to DN, which are discrete signals obtained by consecutively outputting the analog voltages retained in the signal retention circuits 22 included in the delay circuits 117[2] to 117[N]. This output signals Q21-Q2$n$ to QN1-QN$n$ correspond to the sound-source signals D2 to DN delayed by a certain period of time. That is, in the selection circuit 23, a certain delay time is set for the selection signal S, whereby the output signals Q11-Q1$n$ to QN1-QN$n$, which correspond to sound-source signals with a determined delay time, can be output.

The transistors included in the delay circuit 117 are preferably OS transistors. It is particularly preferable to use OS transistors as the transistors included in the signal retention circuits 22 inside the delay circuit 117. In an OS transistor, the current flowing between the source and the drain in an off state (also referred to as "off-state current") is extremely low. Using the OS transistors in the signal retention circuits 22 allows the analog voltages obtained by sampling the sound-source signal to be retained in the signal retention circuits 22 for a long period. In other words, the analog voltages retained in the signal retention circuits 22 do not easily change and the sound-source estimation based on the sound-source signals can be performed more precisely.

In addition, the signal retention circuits 22 using OS transistors can rewrite and read out analog voltages by charging and discharging charges, thereby obtaining and reading out analog voltages substantially without limit of the number of times. A signal retention circuit including OS transistors is superior in rewrite endurance because, unlike a magnetic memory or a resistive random-access memory, it does not go through atomic-level structure change. In addition, unstableness due to the increase of electron trap centers is not observed in a signal retention circuit including OS transistors even when rewrite operation is repeated like in a flash memory.

The signal retention circuits 22 using OS transistors can be freely arranged over a circuit using Si transistors; integration can be easily performed even when a plurality of delay circuits are provided. In addition, since an OS transistor can be fabricated using manufacturing equipment similar to that for a Si transistor, the fabrication is possible at low costs.

Moreover, an OS transistor can be a four-terminal semiconductor element including a back gate electrode in addition to a gate electrode, a source electrode, and a drain electrode. An electric network where input/output of signals flowing between a source and a drain can be independently controlled in accordance with a voltage applied to the gate electrode or the back gate electrode can be constituted. Thus, circuit design with the same idea as that of an LSI is possible. In addition, an OS transistor has electric characteristics superior to those of a Si transistor under high-temperature environments. Specifically, under high temperatures within the range of 125° C. to 150° C., an OS transistor is capable of good switching operation since its on-state current/off-state current ratio is high.

The signal processing circuit 113 has a function of calculating the difference between the output signals, which are selected by the selection circuits 23, calculating an integral value of the difference, and estimating the delay time at which sound-source signals are in phase. The signal processing circuit 113 includes, for example, a differential circuit, an integration circuit, a comparator, and a triangle-wave generation circuit. Two output-signal voltages which are selected by the selection circuits 23 to be compared are input to the differential circuit. The integration circuit outputs a value obtained by integrating an output signal from the differential circuit. To the comparator are input output signals from the integration circuit and the triangle-wave generation circuit.

The signal processing circuit 113 functions as an analog arithmetic circuit. The signal processing circuit 113 compares and processes signals of analog values, which removes a large-area circuit such as an A/D converter circuit and suppresses increase in the circuit area.

Furthermore, the signal processing circuit 113 may be composed of a multiplier circuit. The multiplier circuit can be formed with a logarithmic converter, adder, or anti-logarithmic converter circuit using an operational amplifier. The multiplier circuit can also be formed with a translinear circuit such as a Gilbert cell, for example.

The sound-source detection device 110 of one embodiment of the present invention uses OS transistors as the transistors included in the delay circuit 117. Furthermore, the sound-source detection device 110 of one embodiment of the present invention has a system of retaining charges corresponding to the analog voltages sampled at different timings. Since the OS transistors have an extremely low off-state current, the storage capacitor for retaining the analog voltages can be reduced in size. Thus, the density of incorporated delay circuits 117 can be increased.

In addition, the sound-source detection device 110 of one embodiment of the present invention can read out discrete sound-source signals as output signals by reading out the analog voltages corresponding to the charges retained in the delay circuit 117 at different timings. The delay time can be set to a desired time by changing the timing of the control signal S. This removes conversion of sound-source signals to digital signals to obtain a desired delay time, so that discrete sound-source signals in phase can be achieved.

Figure 12:
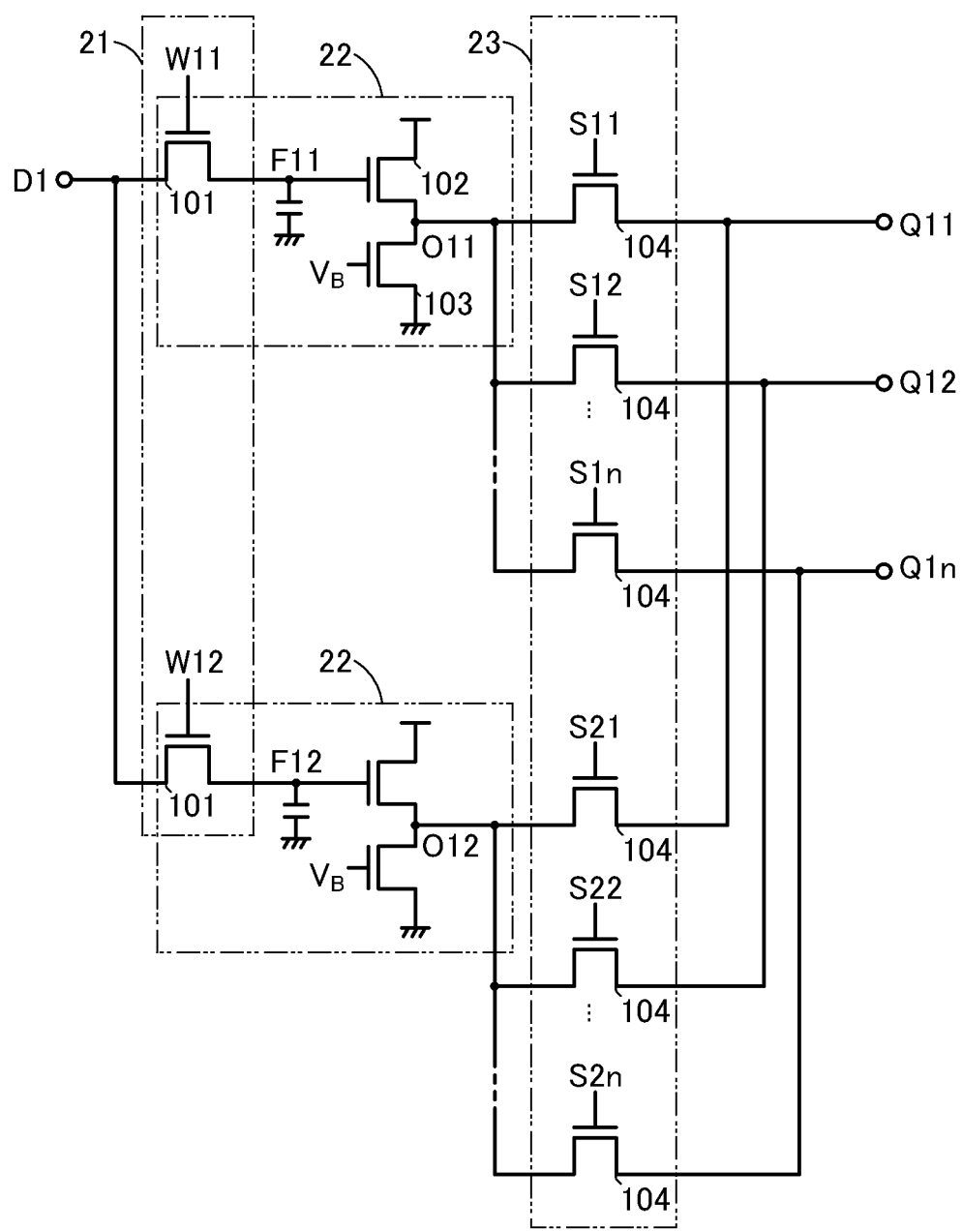
FIG. 12 is a view illustrating a circuit structure example of a delay circuit.

FIG. 12 shows a specific circuit structure example of the delay circuit 117 shown in FIG. 11B. FIG. 12 is a structure example of a delay circuit in which the sound-source signal D1, which is output from the microphone 116, is retained at two nodes and output as three output signals with different delay times.

FIG. 12 shows transistors 101 which are included in the selection circuit 21, the transistors 101, transistors 102, and transistors 103 which are included in the signal retention circuits 22, and transistors 104 which are included in the selection circuit 23. The transistors 101 to 104 are re-channel transistors, and function as switches that are turned on by the H-level control signal and turned off by the L-level control signal.

FIG. 12 shows selection signals W11 and W12 as the selection signal W. The selection signals W11 and W12 are signals for sampling the analog voltage of the sound-source signal D1 at different timings.

FIG. 12 shows nodes F11 and F12, which are for retaining the analog voltages sampled by the selection circuit 21. In the structure shown in FIG. 12, the nodes F11 and F12 are connected to the gates of the transistors 102, which are input terminals of the source-follower circuits. In the structure, bias voltages VB of the source-follower circuits are applied to the gates of the transistors 103. Although capacitors are connected to the nodes F11 and F12 in the drawing, the capacitors can be omitted when the gate capacitance of the transistors 102 is sufficiently large. Nodes to which the transistors 102 and the transistors 103, which are included in the source-follower circuits, are connected are shown as O11 and O12 in FIG. 12. The voltages of the nodes O11 and O12 correspond to the analog voltages of the nodes F11 and F12. The source-follower circuits can improve charge-providing ability to the following selection circuit 23.

FIG. 12 shows selection signals S11 to S1$n$ and S21 to S2$n$ as the selection signal S for the selection circuit 23. The selection signals S11 to S1$n$ have a function of outputting the voltage of the node O11 to the output signals Q11 to Q1$n$. By adjustment of the timing of supplying the selection signals S11 to S1n, the output signals Q11 to Q1$n$ can become signals of the voltage of the node O11 delayed by a certain period. Furthermore, the selection signals S21 to S2$n$ have a function of outputting the voltage of the node O12 to the output signals Q11 to Q1$n$. By adjustment of the timing of supplying the selection signals S21 to S2$n$, the output signals Q11 to Q1$n$ can become signals of the voltage of the node O12 delayed by a certain period.

Next, the operation of the delay circuit 117 shown in FIG. 12 is described with reference to FIG. 13 to FIG. 16.

Figure 13A:
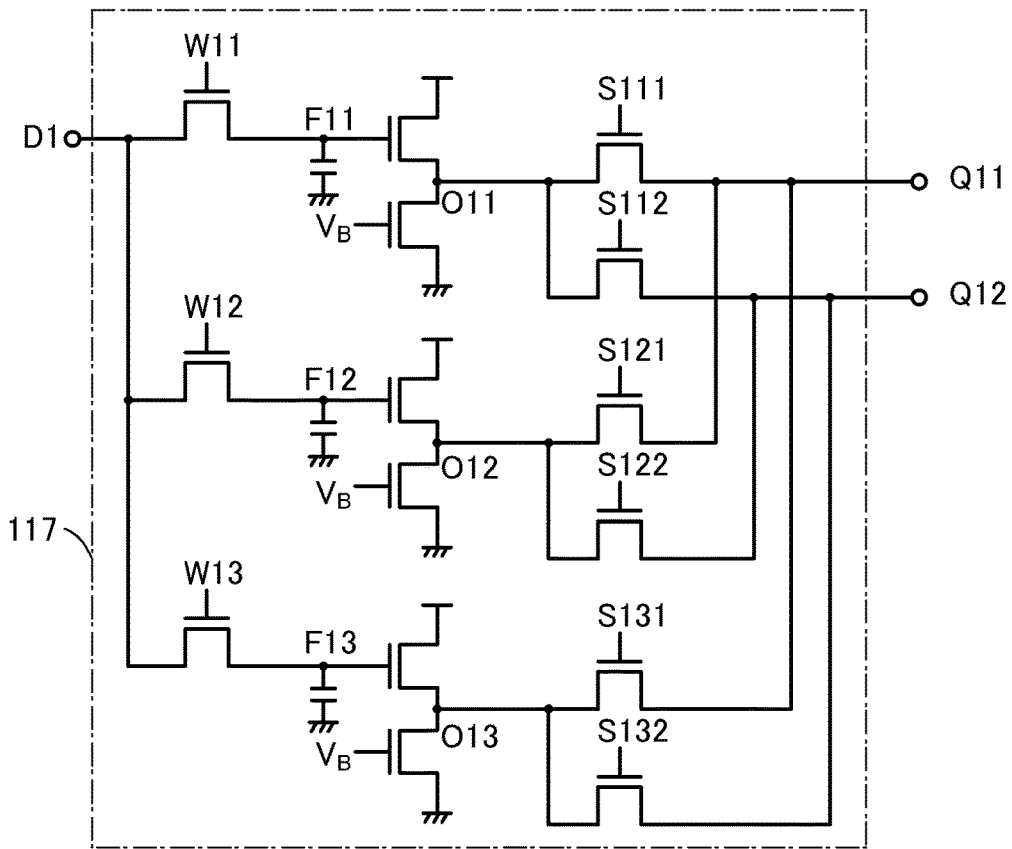
FIG. 13A and FIG. 13B are views illustrating an operation example of a delay circuit.

FIG. 13A is a structure example of the delay circuit 117; to facilitate the understanding of the operation in FIG. 12, the selection signal W for sampling the sound-source signal is selection signals W11 to W13, and the selection signal S for reading out a retained plurality of analog voltages as the output signals Q11 and Q12 is selection signals S111, S112, S121, S122, S131, and S132. The delay circuit 117 in FIG. 13A has a structure which samples the sound-source signal at three different timings to obtain three analog voltages and outputs two output signals with different delay times at two different timings. In addition, FIG. 13A shows the node F11 to a node F13 and the node O11 to a node O13.

Figure 13B:
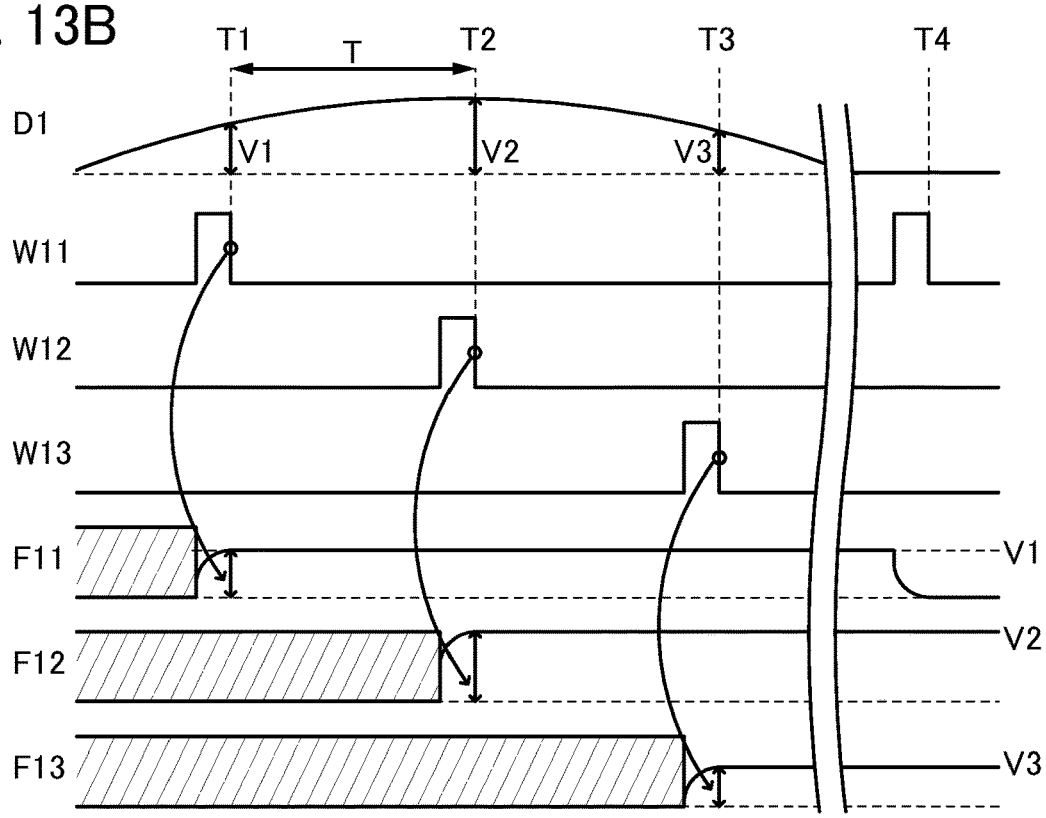

FIG. 13B is a timing chart showing a sampling operation for the sound-source signal D1, which is connected to the delay circuit 117 in FIG. 13A. FIG. 13B shows a waveform of the sound-source signal D1, and the operation of the selection signals W11 to W13 and voltages written to the nodes F11 to F13 at times T1 to T4. In the drawing showing the timing chart, the periods with hatching are periods in unstable state.

To sample the sound-source signal D1, the selection signal W11 is set to the H level at the time T1 and a voltage V1 of the sound-source signal D1 is written to the node F11, as described above.

At the time T2, which is a period T later, the selection signal W12 is set to the H level and a voltage V2 of the sound-source signal D1 is written to the node F12 to sample the sound-source signal D1. Note that the period T is preferably short. This increases the number of samplings of the sound-source signal and improves the angular resolution.

At the time T3, the selection signal W13 is set to the H level and a voltage V3 of the sound-source signal D1 is written to the node F13 to sample the sound-source signal D1.

The voltages V1 to V3 retained at the nodes F11 to F13 can be retained by setting the selection signals W11 to W13 to the L level. To initialize them, the sound-source signal at a constant potential is given and the selection signal W11 is set to the H level as shown in the time T4.

Figure 14:
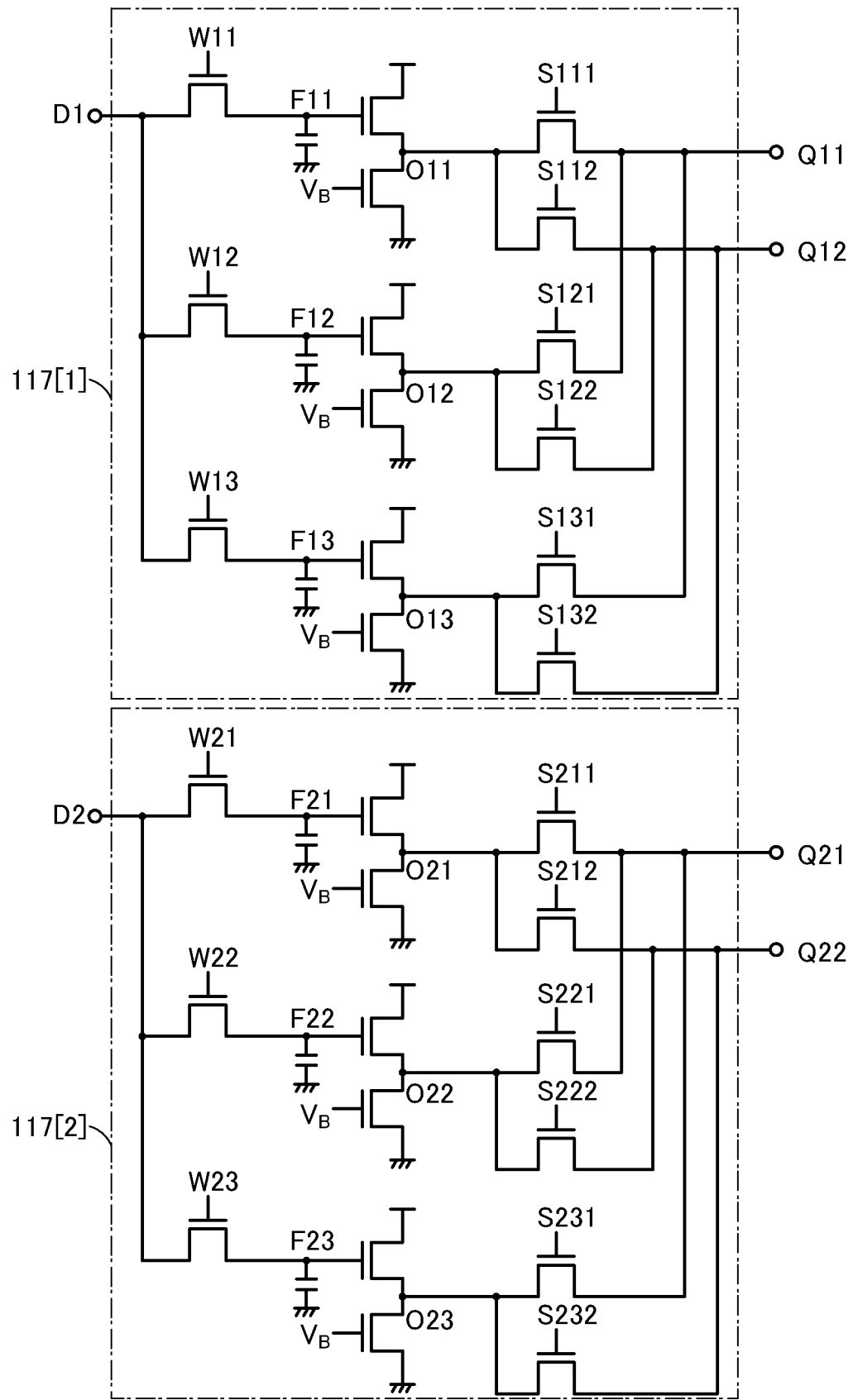
FIG. 14 is a view illustrating a circuit structure example of delay circuits.

FIG. 14 is a structure example of the delay circuit 117[1] and the delay circuit 117[2]. To facilitate the understanding of the operation in FIG. 12, the selection signal W for sampling the sound-source signal D1 is the selection signals W11 to W13; the selection signal S for reading out retained voltages as the output signals Q11 and Q12 is the selection signals S111, S112, S121, S122, S131, and S132; the selection signal W for sampling the sound-source signal D2 is the selection signals W21 to W23; and the selection signal S for reading out retained voltages as the output signals Q21 and Q22 is the selection signals S211, S212, S221, S222, S231, and S232. That is, the delay circuits 117[1] and 117[2] in FIG. 14 have a structure which obtains three analog voltages and outputs two output signals with different delay times at two different timings. In addition, FIG. 14 shows the nodes F11 to F13, nodes F21 to F23, the nodes O11 to O13, and nodes O21 to O23.

Figure 15:
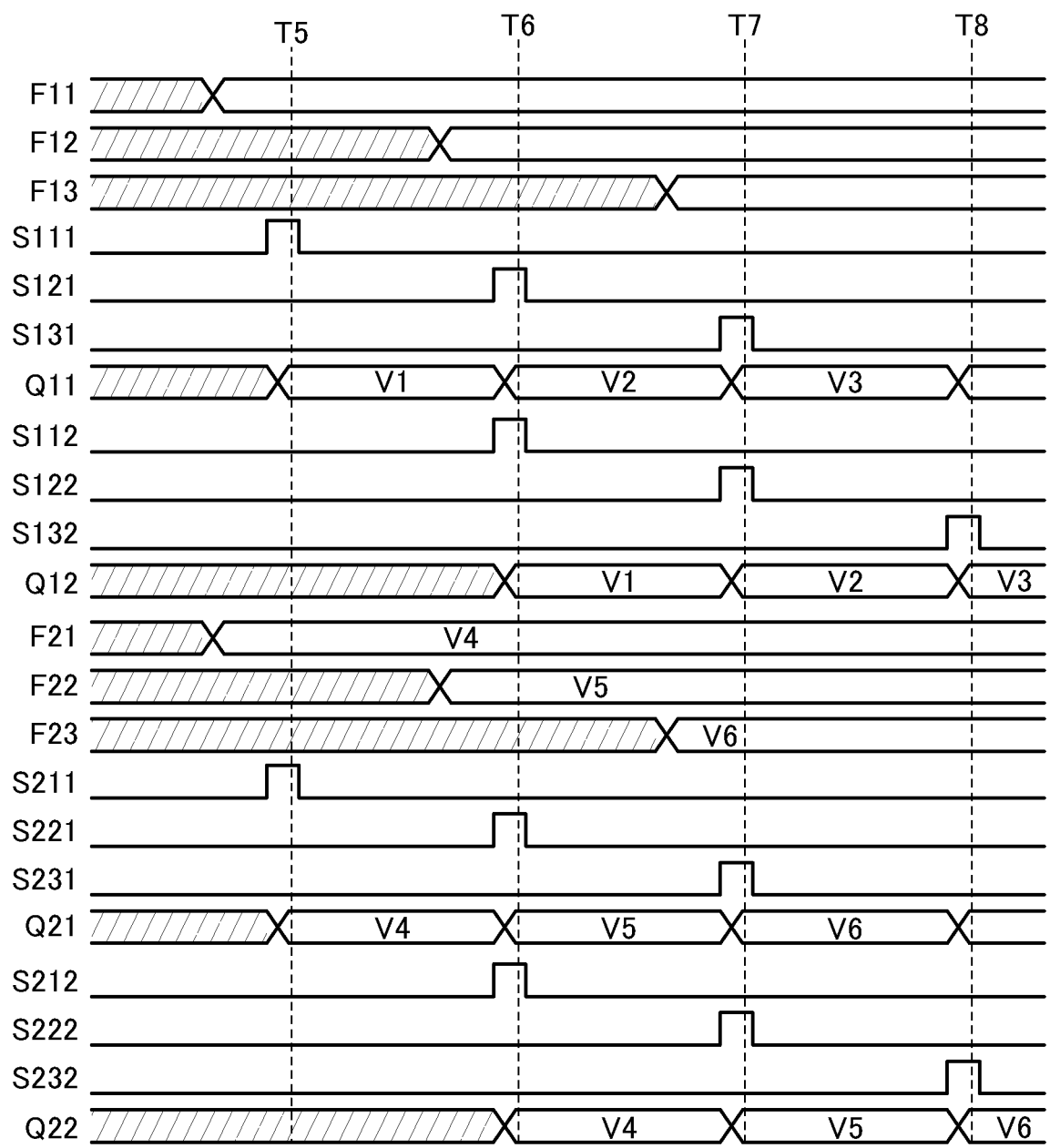
FIG. 15 is a timing chart showing an operation example of delay circuits.

FIG. 15 is a timing chart showing the operations of reading out the voltages V1 to V3 which are retained at the nodes F11 to F13 respectively in the delay circuit 117[1] in FIG. 14, and the voltages V4 to V6 which are retained at the nodes F21 to F23 in the delay circuit 117[2] in FIG. 14, as the output signals Q11, Q12, Q21, and Q22. FIG. 15 shows the operations at times T5 to T8 of the output signals Q11, Q12, Q21, and Q22, which are read out from the nodes F11 to F13 and the nodes F21 to F23 by the selection signals S111, S112, S121, S122, S131, S132, S211, S212, S221, S222, S231, and S232.

At the time T5, the selection signal S111 is set to the H level, and the voltage corresponding to the voltage V1 at the node F11 is output as the output signal Q11. At the same time T5, the selection signal S211 is set to the H level, and the voltage corresponding to the voltage V4 at the node F21 is output as the output signal Q21.

At the time T7, the selection signal S131 is set to the H level, and the voltage corresponding to the voltage V3 at the node F13 is output as the output signal Q11. At the same time T7, the selection signal S122 is set to the H level, and the voltage corresponding to the voltage V5 at the node F12 is output as the output signal Q12. At the same time T7, the selection signal S231 is set to the H level, and the voltage corresponding to the voltage V6 at the node F23 is output as the output signal Q21. At the same time T7, the selection signal S222 is set to the H level, and the voltage corresponding to the voltage V5 at the node F22 is output as the output signal Q22.

At the time T8, the selection signal S132 is set to the H level, and the voltage corresponding to the voltage V3 at the node F13 is output as the output signal Q12. At the same time T8, the selection signal S232 is set to the H level, and the voltage corresponding to the voltage V6 at the node F23 is output as the output signal Q22.

The output signal Q12 can be obtained as the delayed output signal Q11 as shown in FIG. 15. Similarly, the output signal Q22 can be obtained as the delayed output signal Q21. By controlling the timing of the selection signal S, the signals retained in the signal retention circuits can be output with any delay period. When the distance between the sound source and the microphone is different between the delay circuit 117[1] and the delay circuit 117[2], for example, the sound-source signals can be in phase by changing the delay period, whereby the sound-source direction can be estimated.

Figure 16A:
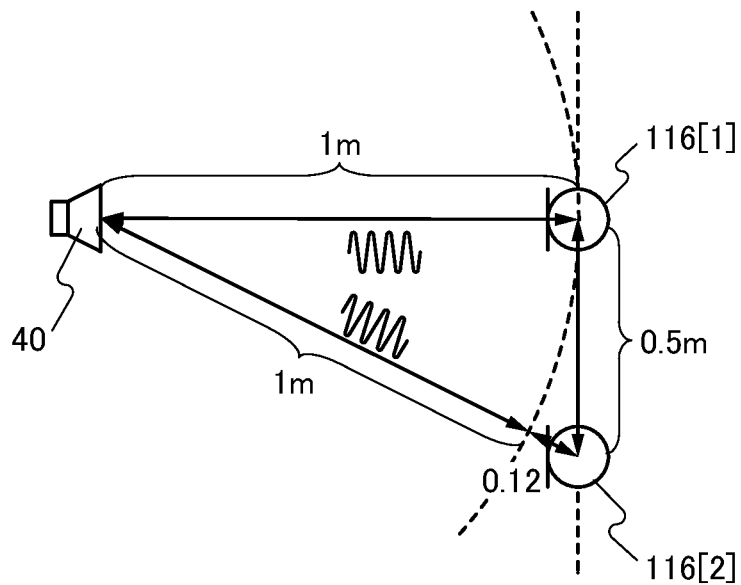
FIG. 16A and FIG. 16B are views showing a technology for estimating the sound-source direction.

FIG. 16A is a schematic diagram showing the above-described technology for estimating the sound-source direction, in which the output signals corresponding to the sound-source signal are made to be in phase by changing the delay period.

FIG. 16A shows the microphones 116[1] and 116[2] as a part of the microphone array as well as a sound source 40. The distance between the sound source 40 and the microphone 116[1] is 1 m and the distance between the microphone 116[1] and the microphone 116[2] is 0.5 m in FIG. 16A for explanation. The distance from the sound source 40 to the microphone 116[2] is approximately 1.12 m. Thus, the sound which reaches the microphone 116[2] from the sound source 40 is delayed by 0.35 ms from the arrival of the sound from the sound source 40 at the microphone 116[1], assuming that the speed of sound is 340 m/s.

Figure 16B:
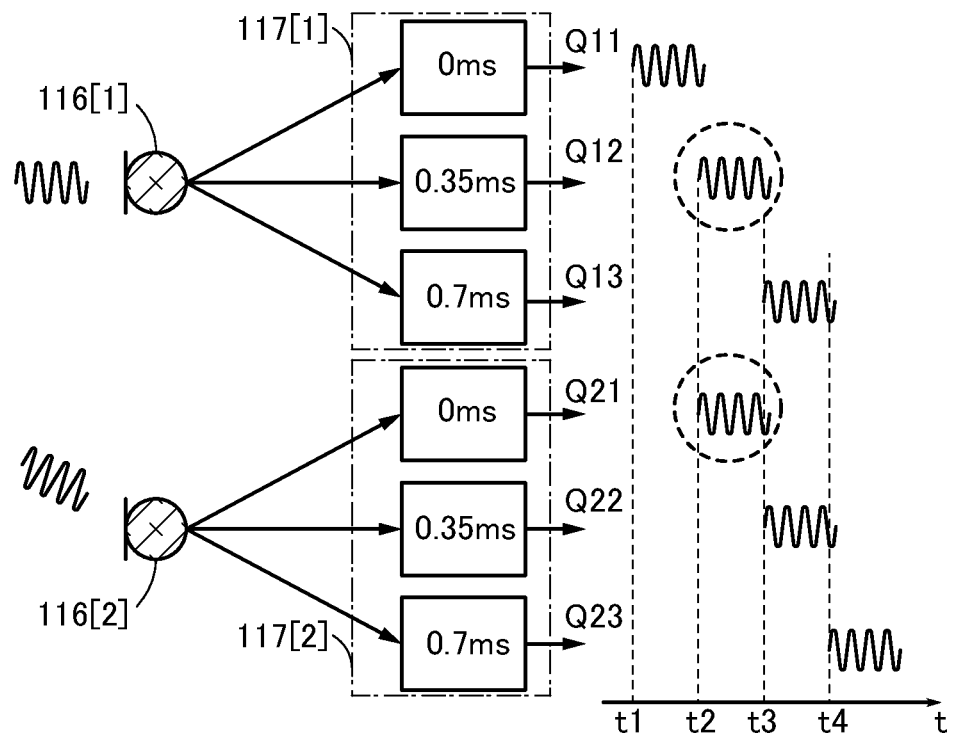

FIG. 16B shows the visualized output signals Q11 to Q13 and Q21 to Q23, which are delayed sound-source signals obtained through the delay circuit 117[1] and the delay circuit 117[2] in the schematic diagram in FIG. 16A. The delay circuits 117[1] and 117[2] delay the output signals; the delay circuits are set to have no delay period (0 ms), a delay period (0.35 ms), and a delay period (0.7 ms) as shown in FIG. 16B.

The microphones 116[1] and 116[2] have different sound-arrival times, and the output signals output from both of the delay circuits 117[1] and 117[2] do not match at a time t1 with no delay period (0 ms) as shown in FIG. 16B. Meanwhile, the output signal output from the delay circuit 117[1]

with a delay period (0.35 ms) and the output signal output from the delay circuit 117[2] with no delay period match at a time t2. This also applies to the output signals obtained at times t3 and t4. By comparing the output signals passing through different delay circuits, correspondence/incorrespondence of output-signal phases is determined, which can be utilized for sound-source estimation.

As shown in schematic diagrams of FIG. 16A and FIG. 16B, the output signals based on the sampled sound-source signal are delayed and the output signals are compared to each other. The delay period of a phase of a sound which comes from the target direction can be estimated; by calculating the difference of the distance to the sound source using the delay time, the device can focus on the target direction and function as the sound-source localization device.

Figure 17:
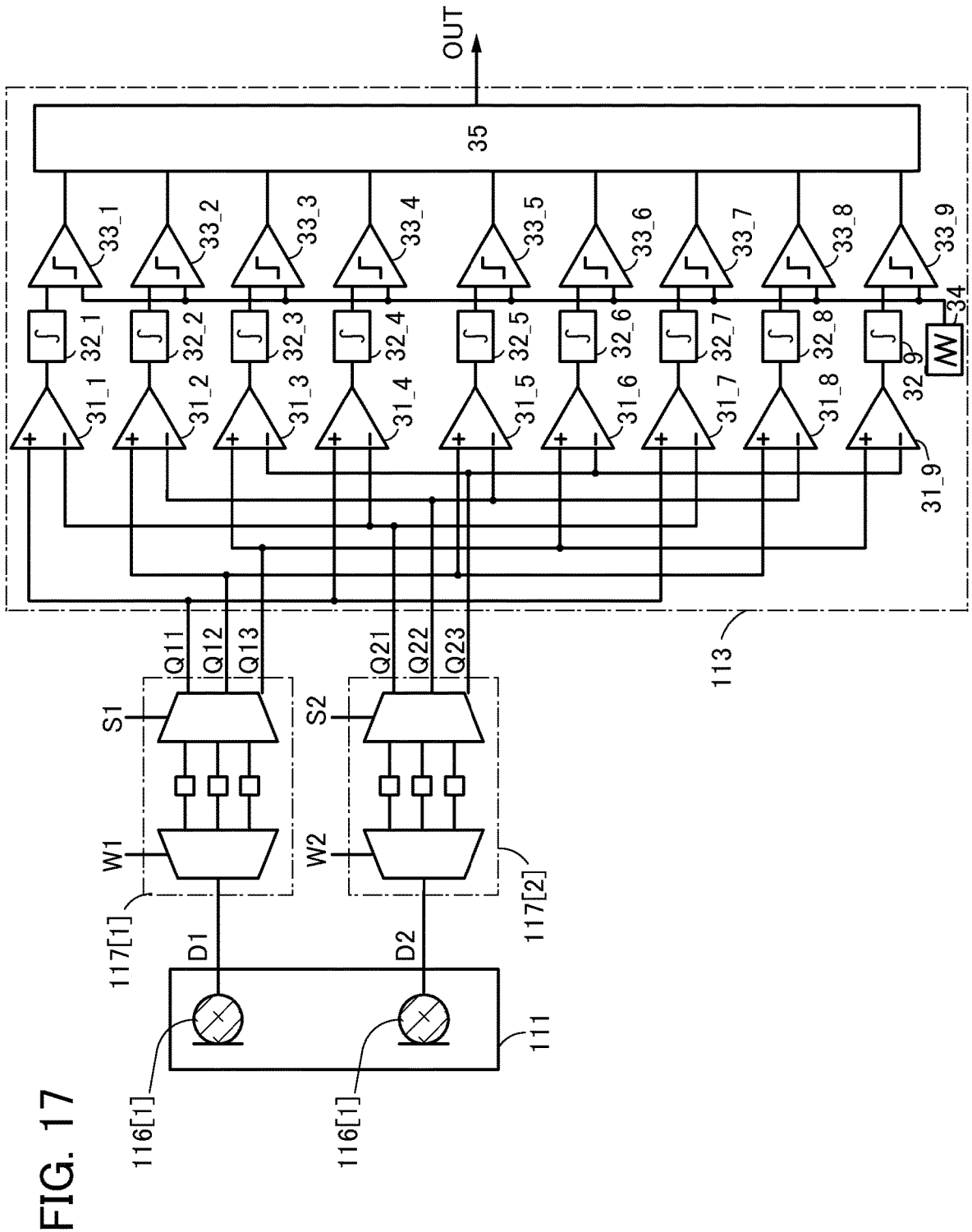
FIG. 17 is a view illustrating a circuit structure example of a signal processing circuit.

FIG. 17 shows a specific structure example of the signal processing circuit 113. The signal processing circuit 113 in FIG. 17 includes differential circuits 31_1 to 31_9, integration circuits 32_1 to 32_9, comparators 33_1 to 33_9, a triangle-wave generation circuit 34, and an arithmetic circuit 35.

The differential circuits 31_1 to 31_9 calculate the difference between the output signals (the output signals Q11 to Q13 and Q21 to Q23 in the example of FIG. 17) from each delay circuit (the delay circuits 117[1] and 117[2] in the example of FIG. 17). The integration circuits 32_1 to 32_9 receive the output signals from the differential circuits 31_1 to 31_9 respectively, and integrate the output signals. To the comparators 33_1 to 33_9 are input a triangle wave from the triangle-wave generation circuit 34 and the output signals from the integration circuits 32_1 to 32_9, and the comparators 33_1 to 33_9 compare the voltages. The arithmetic circuit 35 receives the output signals from the comparators 33_1 to 33_9 and estimates delay time for making the sound-source signals be in phase, thereby obtaining an output signal OUT from the delay time, which corresponds to the difference in the distance to the sound source.

Figure 18A:
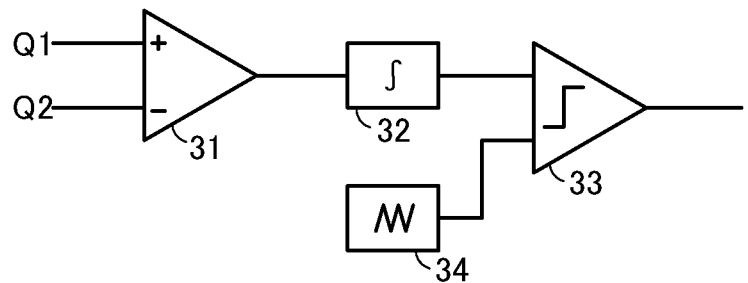
FIG. 18A, FIG. 18B, and FIG. 18C are views illustrating a circuit structure example of a signal processing circuit.

Specific examples of the circuit included in the signal processing circuit 113 are described with reference to FIG. 18A to FIG. 18C. FIG. 18A is a block diagram showing a structure of one stage in the signal processing circuit 113 in FIG. 17. FIG. 18A shows a differential circuit 31, to which the output signals Q1 and Q2 are input, an integration circuit 32, a comparator 33, and a triangle-wave generation circuit 34, for example.

Figure 18B:
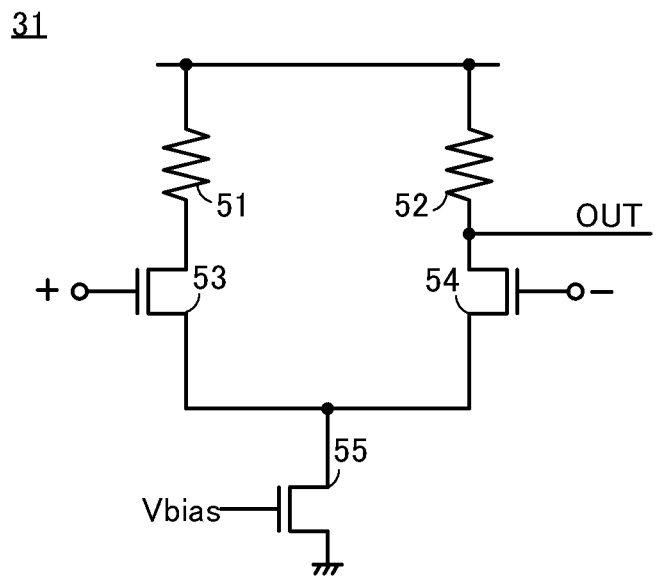

A structure example of the differential circuit 31 is shown in FIG. 18B. The differential circuit 31 includes a resistor 51, a resistor 52, a transistor 53, a transistor 54, and a transistor 55, for example. To a gate of the transistor 53 is connected a non-inverting input terminal. To a gate of the transistor 54 is connected an inverting input terminal. To a gate of the transistor 55 is connected a wiring which provides a bias voltage Vbias. On the drain terminal side of the transistor 54 is provided an output terminal OUT of the differential circuit 31.

Figure 18C:
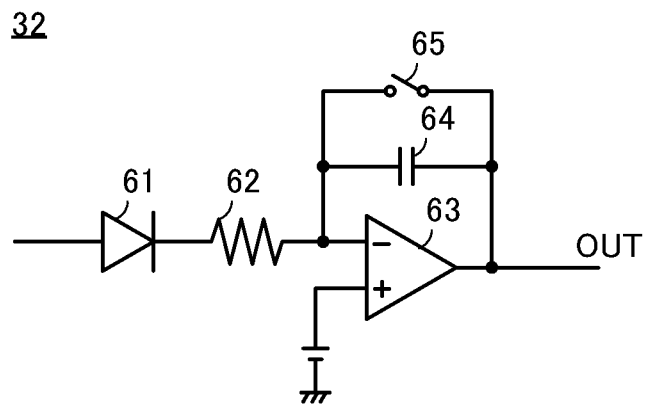

A structure example of the integration circuit 32 is shown in FIG. 18C. The integration circuit 32 includes a diode 61, a resistor 62, an operational amplifier 63, a capacitor 64, and a switch 65, for example. To the input terminal of the diode 61 is given the output signal of the differential circuit 31. To the output terminal of the operational amplifier is provided the output terminal OUT of the integration circuit 32.

Figure 19A:
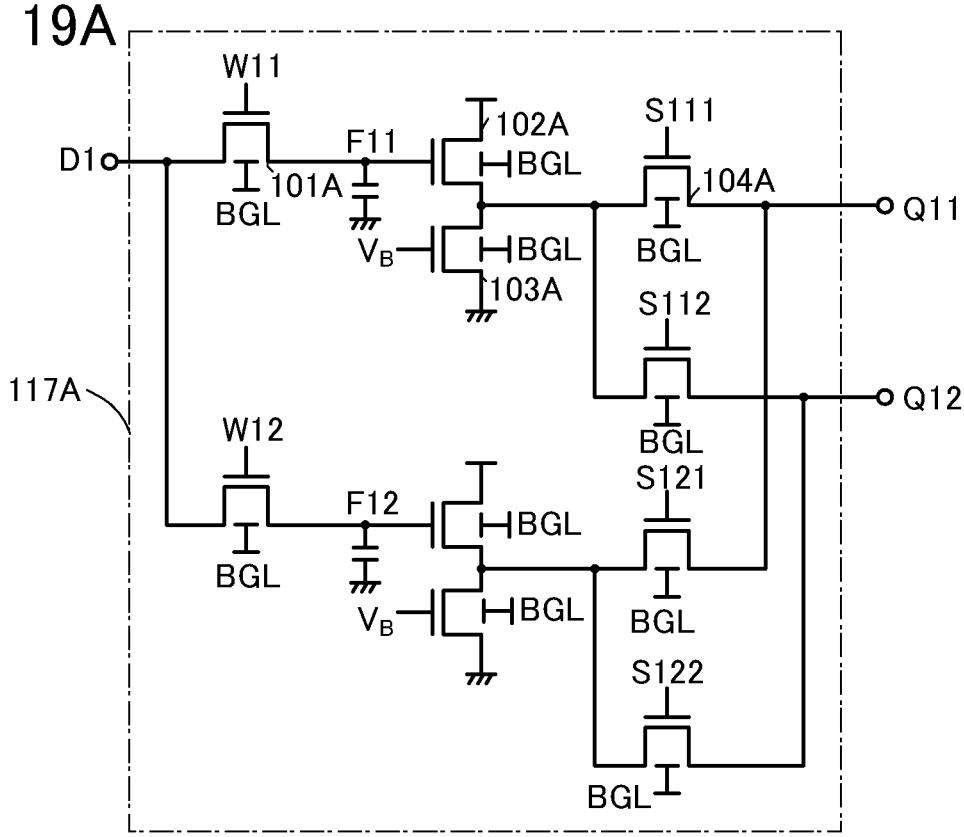
FIG. 19A and FIG. 19B are views illustrating circuit structure examples of a delay circuit.
Figure 19B:
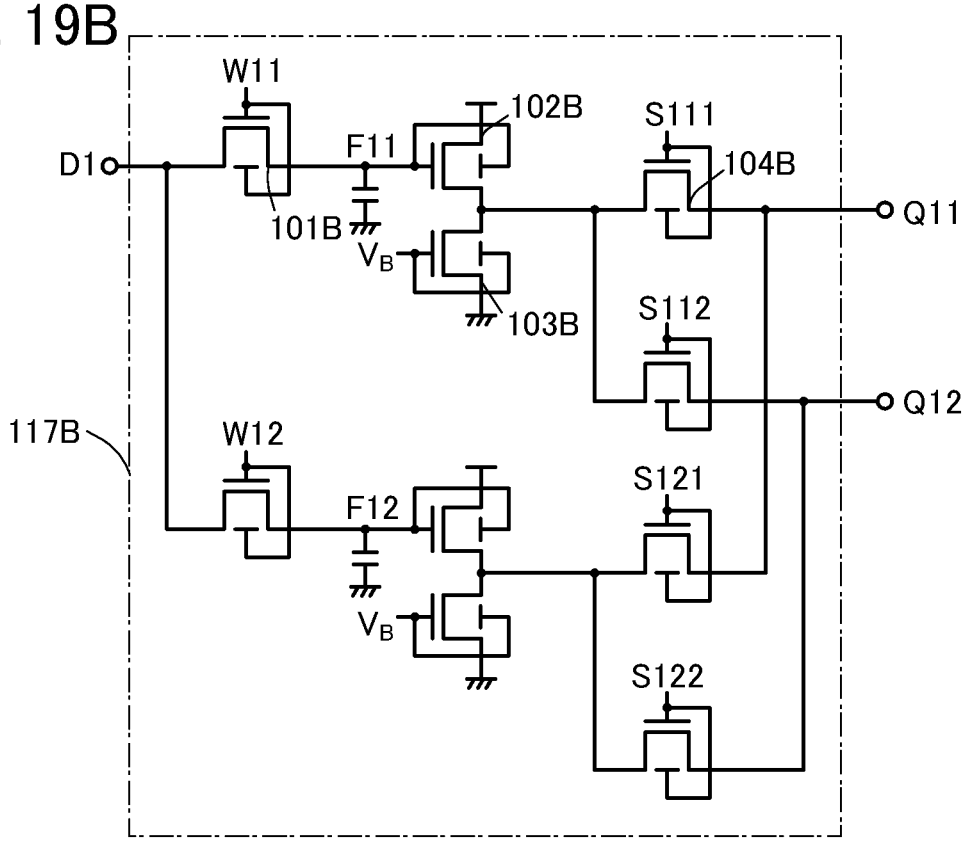

FIG. 19A and FIG. 19B show variation examples of circuit structures, which can be used for each transistor in the above-described delay circuit 117.

The transistors 101 to 104 shown in FIG. 12, FIG. 13A, and the like have a top-gate structure or a bottom-gate structure without a back gate electrode; however they are not limited thereto. For example, transistors 101A to 104A, which have a back gate electrode, may be employed like in a delay circuit 117A in FIG. 19A. With the structure of FIG. 19A, the states of the transistors 101A to 104A can be controlled from the outside more easily.

The transistors 101 to 104 shown in FIG. 12, FIG. 13A, and the like have a top-gate structure or a bottom-gate structure without a back gate electrode; however they are not limited thereto. For example, transistors 101B to 104B, which have back gate electrodes connected to their gate electrodes, may be employed like in a delay circuit 117B in FIG. 19B. With the structure of FIG. 19B, the amount of current flowing through the transistors 101B to 104B can be increased.

Figure 20A:
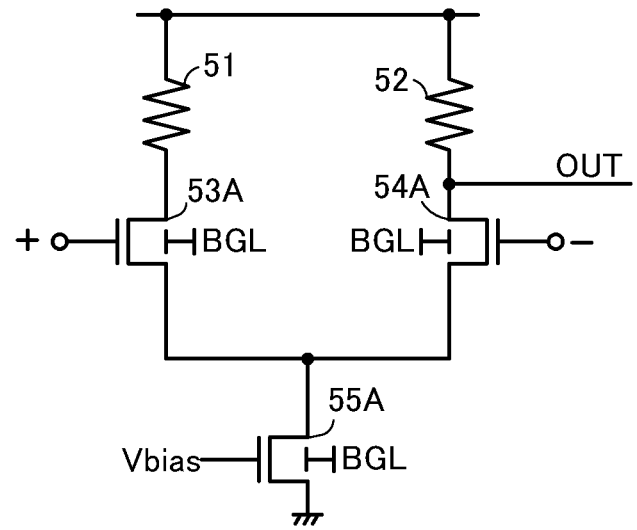
FIG. 20A and FIG. 20B are views illustrating circuit structure examples of a differential circuit.
Figure 20B:
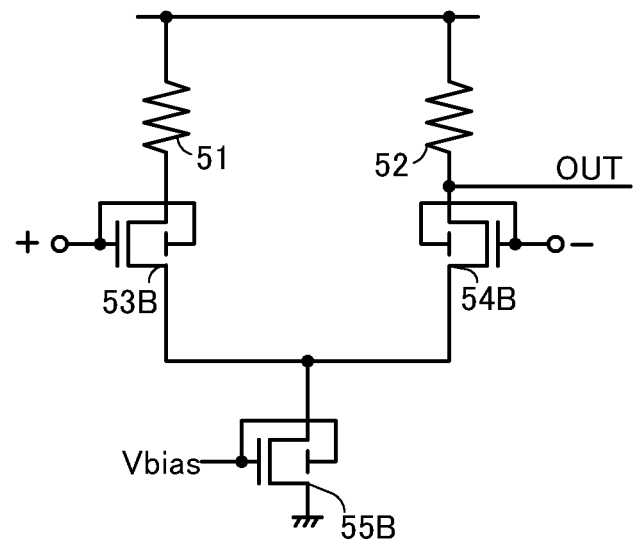

FIG. 20A and FIG. 20B show variation examples of circuit structures which can be used for each transistor in the above-described differential circuit 31.

The transistors 53 to 55 shown in FIG. 18B have a top-gate structure or a bottom-gate structure without a back gate electrode; however they are not limited thereto. For example, transistors 53A to 55A, which have a back gate electrode, may be employed like in a differential circuit 31A in FIG. 20A. With the structure of FIG. 20A, the states of the transistors 53A to 55A can be controlled from the outside more easily.

The transistors 53 to 55 shown in FIG. 18B have a top-gate structure or a bottom-gate structure without a back gate electrode; however they are not limited thereto. For example, transistors 53B to 55B, which have back gate electrodes connected to their gate electrodes, may be employed like in a differential circuit 31B in FIG. 20B. With the structure of FIG. 20B, the amount of current flowing through the transistors 53B to 55B can be increased.

The above-described semiconductor device of one embodiment of the present invention can collectively retain the signals from a plurality of microphones as the analog-value signals and can output delayed signals. The semiconductor device can process signals with analog voltages. Accordingly, the A/D converter circuit for processing signals can be removed, reducing malfunctions due to frequency differences and unsynchronization, which are caused by vast amount of arithmetic processing or the like. The semiconductor device of one embodiment of the present invention can be used not only for the sound-source localization technology, which identifies the direction where a specific sound comes, but also for a technology of estimating the state by using phase differences of received signals, for example.

This embodiment can be implemented in combination with the structures described in the other embodiments as appropriate.

Embodiment 3

In this embodiment, structures of a transistor that can be used in a semiconductor device such as the vehicle alarm device 200 described in the above embodiment will be described. Specifically, a structure in which transistors having different electrical characteristics are stacked will be described. With the structure, the degree of freedom in design of the semiconductor device can be increased. Stacking transistors having different electrical properties can increase the integration degree of the semiconductor device.

Figure 21:
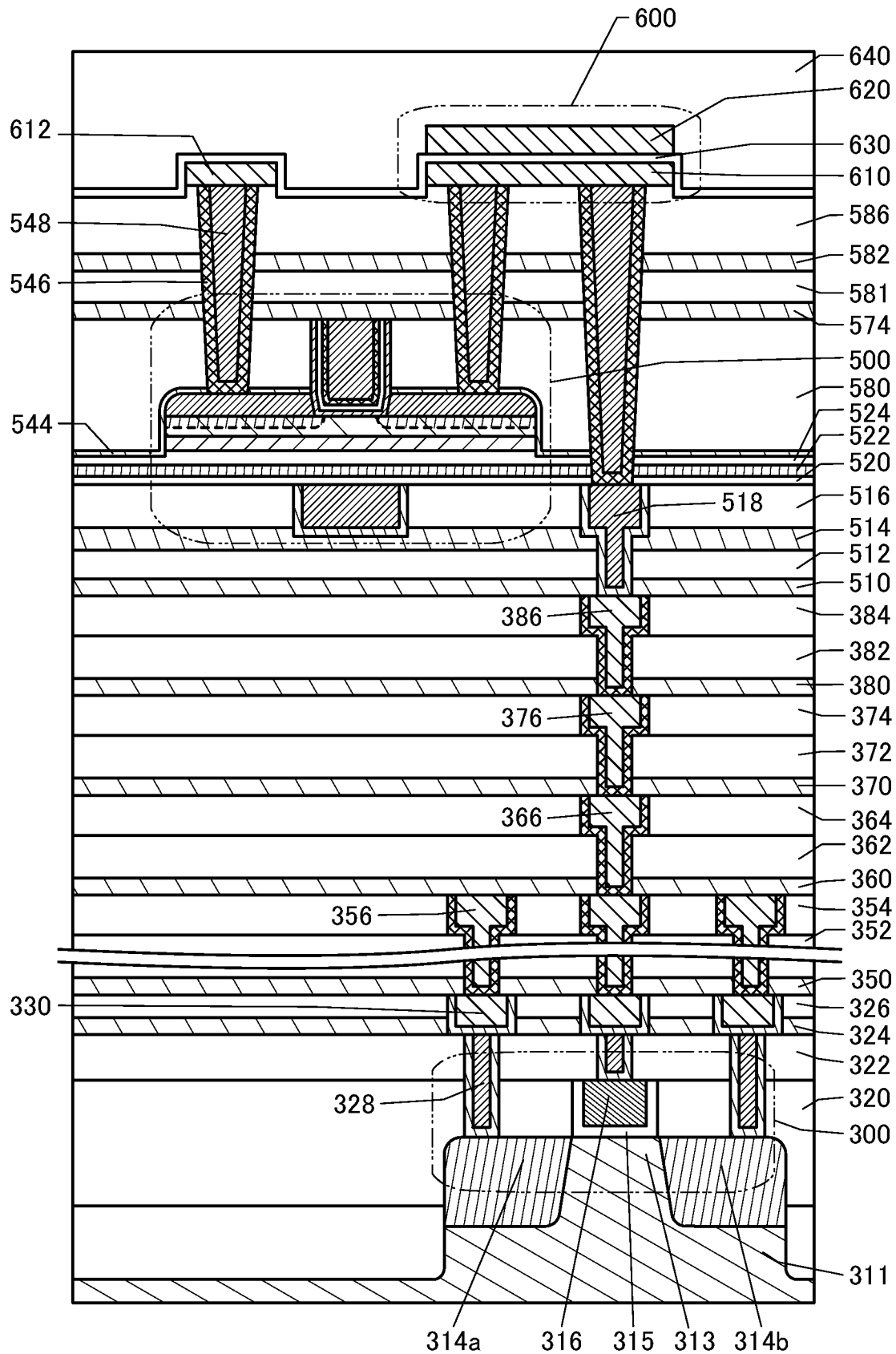
FIG. 21 is a view illustrating a structure example of a semiconductor device.
Figure 23A:
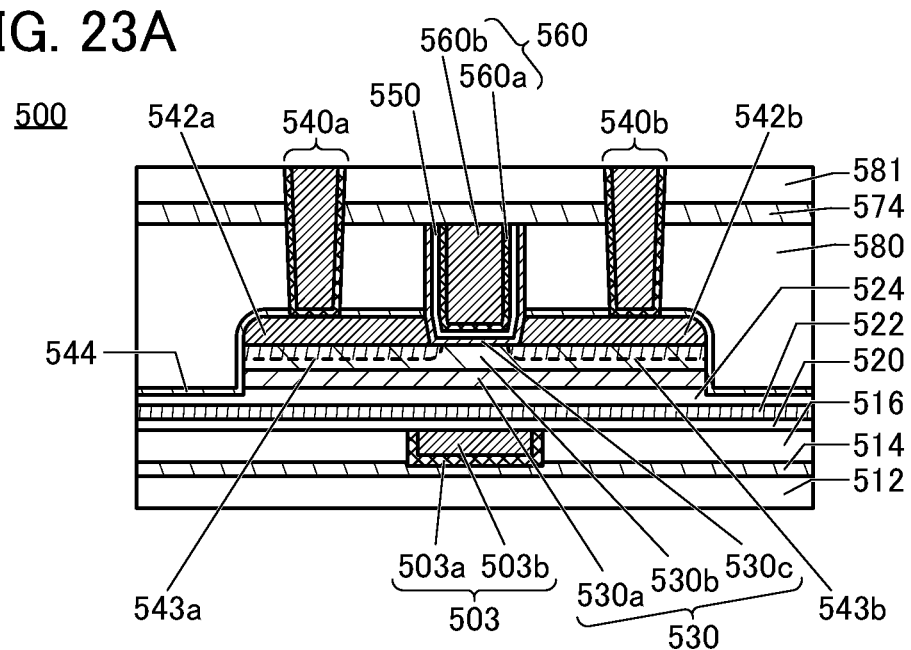
FIG. 23A, FIG. 23B, and FIG. 23C are views illustrating structure examples of transistors.
Figure 23B:
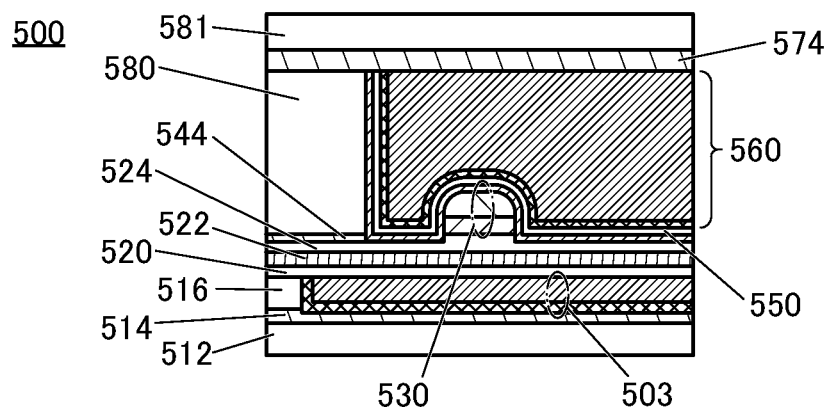
Figure 23C:
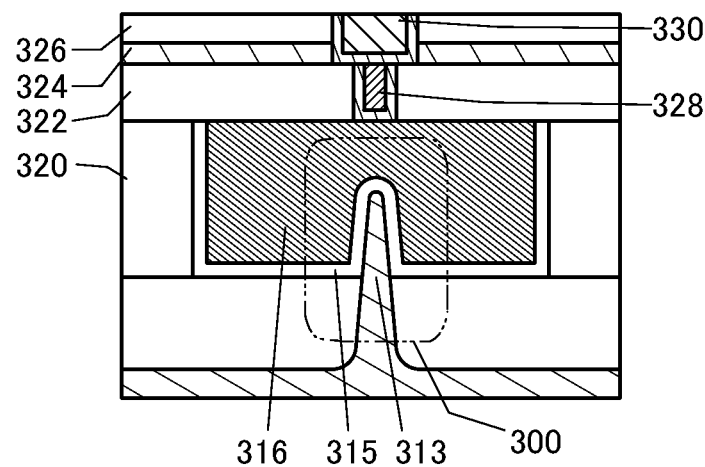

A semiconductor device illustrated in FIG. 21 includes a transistor 300, a transistor 500, and a capacitor 600. FIG. 23A is a cross-sectional view of the transistor 500 in the channel length direction, FIG. 23B is a cross-sectional view of the transistor 500 in the channel width direction, and FIG. 23C is a cross-sectional view of the transistor 300 in the channel width direction.

The transistor 500 is an OS transistor. Since the off-state current of the transistor 500 is low, the use of the transistor 500 as a transistor included in a semiconductor device enables long-term retention of written data voltage or charges. In other words, power consumption of the semiconductor device can be reduced because the semiconductor device has a low frequency of refresh operation or requires no refresh operation.

The semiconductor device described in this embodiment includes the transistor 300, the transistor 500, and the capacitor 600, as shown in FIG. 21. The transistor 500 is provided above the transistor 300, and the capacitor 600 is provided above the transistor 300 and the transistor 500.

The transistor 300 is provided over a substrate 311 and includes a conductor 316, an insulator 315, a semiconductor region 313 that is part of the substrate 311, and a low-resistance region 314a and a low-resistance region 314b each functioning as a source region or a drain region. Note that the transistor 300 can be used as the transistor included in a buffer circuit 17 in the above embodiment, for example.

As shown in FIG. 23C, in the transistor 300, a top surface and a side surface in the channel width direction of the semiconductor region 313 are covered with the conductor 316 with the insulator 315 therebetween. Such a Fin-type transistor 300 can have an increased effective channel width, and thus have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 22:
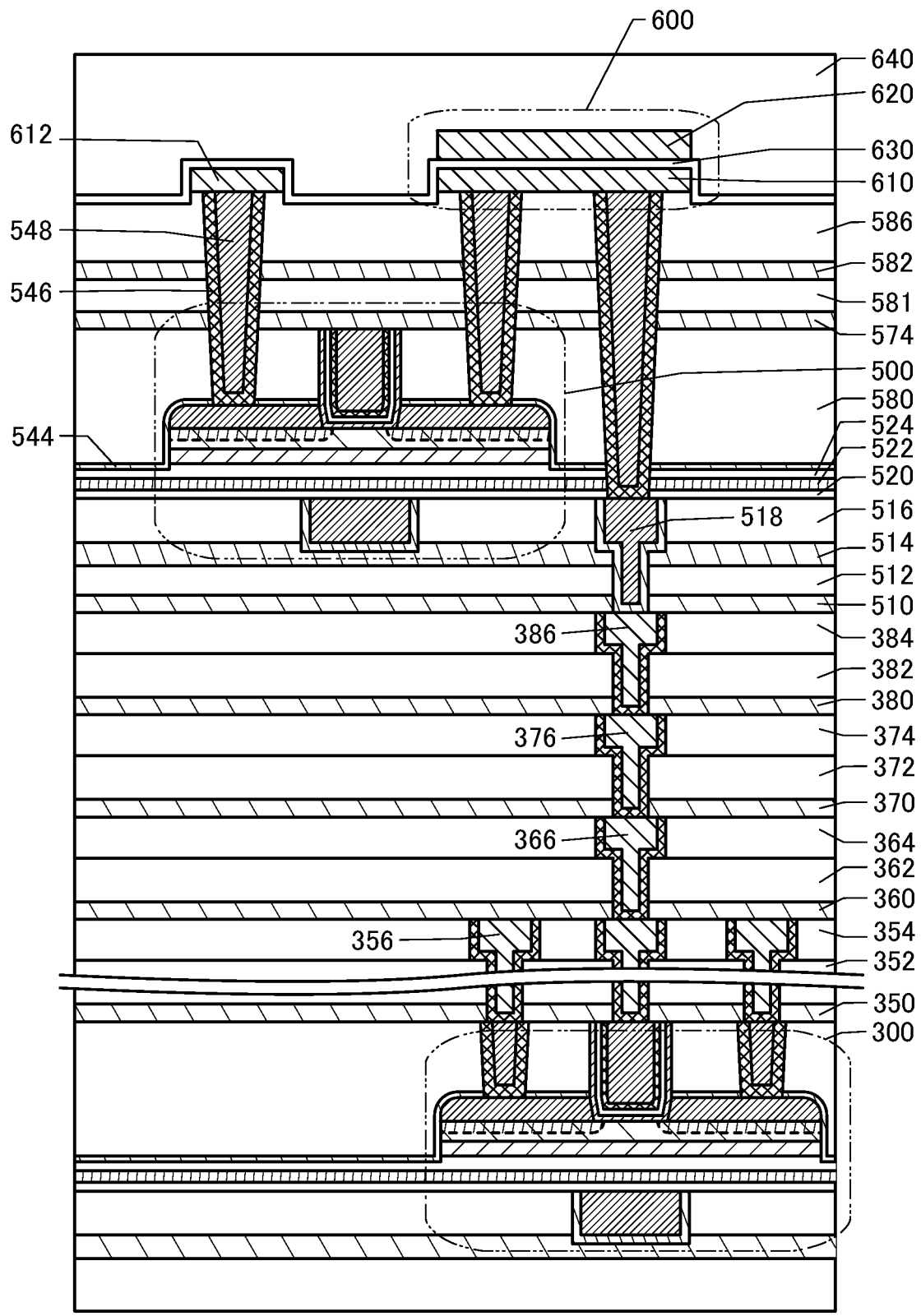
FIG. 22 is a view illustrating a structure example of a semiconductor device.

Note that the transistor 300 illustrated in FIG. 21 is an example and the structure is not limited thereto; an appropriate transistor is used in accordance with a circuit structure or a driving method. In the case where all the transistors included in the semiconductor device are OS transistors and have the same conductivity, which means the same-polarity transistors such as n-channel transistors only, for example, the transistor 300 has a structure similar to that of the transistor 500 including an oxide semiconductor as shown in FIG. 22. Note that the details of the transistor 500 are described later.

An insulator 320, an insulator 322, an insulator 324, and an insulator 326 are stacked sequentially to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 21, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by a barrier layer, so that diffusion of hydrogen from the transistor 300 into the transistor 500 can be inhibited.

Note that for the conductor having a barrier property against hydrogen, tantalum nitride is preferably used, for example. In addition, using a stack of tantalum nitride and tungsten, which has high conductivity, can inhibit diffusion of hydrogen from the transistor 300 while the conductivity of a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 21, an insulator 360, an insulator 362, and an insulator 364 are stacked sequentially. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 364 and the conductor 366. For example, in FIG. 21, an insulator 370, an insulator 372, and an insulator 374 are stacked sequentially. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 374 and the conductor 376. For example, in FIG. 21, an insulator 380, an insulator 382, and an insulator 384 are stacked sequentially. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by a barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low dielectric constant is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by a layer having a barrier property against oxygen, hydrogen, and water; thus, diffusion of hydrogen from the transistor 300 into the transistor 500 can be inhibited.

The transistor 500 is provided above the insulator 516.

As shown in FIG. 23A and FIG. 23B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530$a$ positioned over the insulator 524; an oxide 530$b$ positioned over the oxide 530$a$; a conductor 542$a$ and a conductor 542$b$ positioned apart from each other over the oxide 530$b$; an insulator 580 that is positioned over the conductor 542$a$ and the conductor 542$b$ and is provided with an opening formed to overlap with a region between the conductor 542$a$ and the conductor 542$b$; an oxide 530$c$ positioned on a bottom and a side surface of the opening; an insulator 550 positioned on a formation surface of the oxide 530$c$; and a conductor 560 positioned on a formation surface of the insulator 550.

In addition, as shown in FIG. 23A and FIG. 23B, an insulator 544 is preferably positioned between the insulator 580 and the oxide 530$a$, the oxide 530$b$, the conductor 542$a$, and the conductor 542$b$. Furthermore, as shown in FIG. 23A and FIG. 23B, the conductor 560 preferably includes a conductor 560$a$ provided inside the insulator 550 and a conductor 560$b$ provided to be embedded inside the conductor 560$a$. Moreover, as shown in FIG. 23A and FIG. 23B, an insulator 574 is preferably positioned over the insulator 580, the conductor 560, and the insulator 550.

Note that in this specification and the like, the oxide 530$a$, the oxide 530$b$, and the oxide 530$c$ are sometimes collectively referred to as an oxide 530.

Note that although a structure of the transistor 500 in which three layers of the oxide 530$a$, the oxide 530$b$, and the oxide 530$c$ are stacked in a region where a channel is formed and its vicinity is shown, the present invention is not limited thereto. For example, a single layer of the oxide 530$b$, a two-layer structure of the oxide 530$b$ and the oxide 530$a$, a two-layer structure of the oxide 530$b$ and the oxide 530$c$, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Moreover, the transistor 500 shown in FIG. 21 and FIG. 23A is an example and the structure is not limited thereto; an appropriate transistor is used in accordance with a circuit configuration or a driving method.

Here, the conductor 560 functions as a gate electrode of the transistor, and the conductor 542$a$ and the conductor 542$b$ each function as a source electrode or a drain electrode. As described above, the conductor 560 is formed to be embedded in the opening of the insulator 580 and the region between the conductor 542$a$ and the conductor 542$b$. The positions of the conductor 560, the conductor 542$a$, and the conductor 542$b$ with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542$a$ and the conductor 542$b$ in a self-aligned manner, the conductor 560 does not have a region overlapping with the conductor 542$a$ or the conductor 542$b$. Thus, parasitic capacitance formed between the conductor 560 and each of the conductor 542$a$ and the conductor 542$b$ can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. Furthermore, in this specification and the like, the surrounded channel (S-channel) structure has a feature in that the side surface and the vicinity of the oxide 530 that is in contact with the conductor 542a and the conductor 542b functioning as a source electrode and a drain electrode are of I-type like the channel formation region. Since the side surface and the vicinity of the oxide 530 that is in contact with the conductor 542a and the conductor 542b are in contact with the insulator 544, they can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, the conductor 505 is not necessarily provided. Note that the conductor 503b is shown as a single layer but may have a stacked-layer structure, for example, a stack of the above conductive material and titanium or titanium nitride.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_OH$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is effective to remove impurities such as moisture and hydrogen in an oxide semiconductor (sometimes described as dehydration or dehydrogenation treatment) and to compensate for oxygen vacancies by supplying oxygen to the oxide semiconductor (sometimes described as oxygen adding treatment) in order to obtain an oxide semiconductor whose $V_OH$ is sufficiently reduced. When an oxide semiconductor with sufficiently reduced impurities such as $V_OH$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of $V_OH \rightarrow V_O + H$ occurs. Part of hydrogen generated at this time is bonded to oxygen to be $H_2O$, and removed from the oxide 530 or an insulator near the oxide 530 in some cases. Some hydrogen may be gettered into the conductor 242 in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of $V_O+O\rightarrow$null. Furthermore, hydrogen remaining in the oxide 530 reacts with supplied oxygen, so that the hydrogen can be removed as $H_2O$ (dehydrogenation). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is unlikely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 and an insulator 526 to have a stacked-layer structure that has thermal stability and a high dielectric constant.

Note that in the transistor 500 in FIG. 23A and FIG. 23B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In-M-Zn oxide that can be used as the oxide 530 is particularly preferably a CAAC-OS (c-axis aligned crystalline oxide semiconductor). Furthermore, as the oxide 530, an In—Ga oxide or an In—Zn oxide may be used.

Note that metal oxides functioning as oxide semiconductors are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is unlikely to occur. Furthermore, entry of impurities, formation of defects, or the like might decrease the crystallinity of a metal oxide, which means that the CAAC-OS is a metal oxide including few impurities and defects (e.g., oxygen vacancies). Thus, a metal oxide including a CAAC-OS is physically stable. Therefore, the metal oxide including a CAAC-OS is resistant to heat and highly reliable.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that In—Ga—Zn oxide (also referred to as "IGZO") that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

Furthermore, a metal oxide with a low carrier concentration is preferably used in the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with a sufficiently reduced concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, still further preferably lower than $1 \times 10^{13}$ cm$^{-3}$, still further preferably lower than $1 \times 10^{12}$ cm$^{-3}$. Note that the lower limit of the carrier concentration of the metal oxide in the channel formation region is not particularly limited and can be, for example, $1 \times 10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductors 542a and 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having a MIS structure as its main part.

Note that the above-described layer is not necessarily formed between the conductor 542 and the oxide 530b, but the layer may be formed between the conductor 542 and the oxide 530c, or formed both between the conductor 542 and the oxide 530b and between the conductor 542 and the oxide 530c.

Furthermore, the metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. Moreover, a metal oxide that can be used as the oxide 530a or the oxide 530b can be used as the oxide 530c.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the densities of defect states in mixed layers formed at an interface between the oxide 530a and the oxide 530b and an interface between the oxide 530b and the oxide 530c are preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 23, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as shown in FIG. 23A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with an inner side (a top surface and a side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

Furthermore, to efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 that functions as the first gate electrode and has a two-layer structure is shown in FIGS. 23A and 23B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low dielectric constant is used for these insulators, parasitic capacitance between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

This embodiment can be implemented in combination with the structures described in the other embodiments as appropriate.

Embodiment 4

In this embodiment, an IC chip, an electronic component, electronic devices, and the like are described as examples of a semiconductor device.

Fabrication Method Example of Electronic Component

Figure 24A:
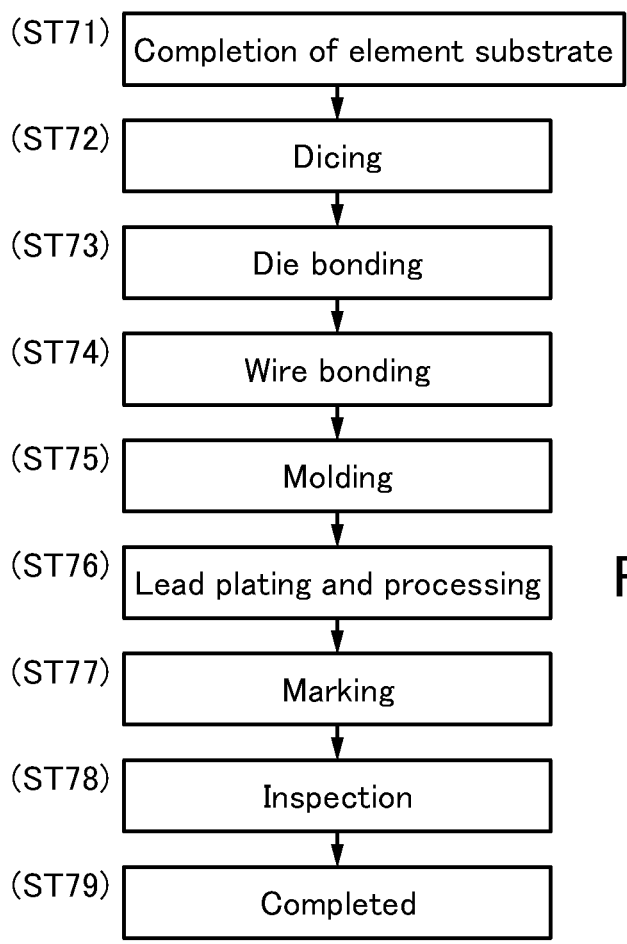
FIG. 24A, FIG. 24B, FIG. 24C, FIG. 24D, and FIG. 24E are views showing structures of a semiconductor wafer and an electronic component.

FIG. 24A is a flowchart showing an example of a method for fabricating an electronic component. The electronic component is also referred to as a semiconductor package or an IC package. The electronic component has a plurality of standards and names depending on a terminal extraction direction and a terminal shape. Thus, examples thereof are described in this embodiment. The electronic component described below corresponds to the electronic component including the transistors of the delay circuits included in the semiconductor device.

A semiconductor device including a transistor is completed by integrating detachable components on a printed circuit board through an assembly process (post-process). The post-process can be finished through steps in FIG. 24A. Specifically, after an element substrate obtained in a pre-process is completed (Step ST71), a rear surface of the substrate is ground. The substrate is thinned in this step to reduce warpage or the like of the substrate in the pre-process and to reduce the size of the component. Next, the substrate is divided into a plurality of chips in a dicing step (Step ST72).

Figure 24B:
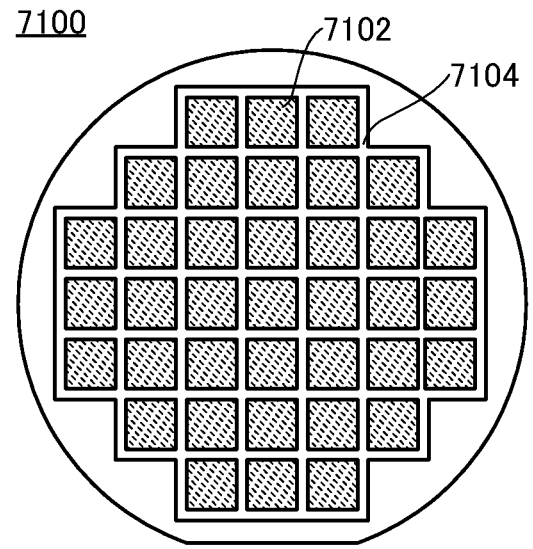
Figure 24C:
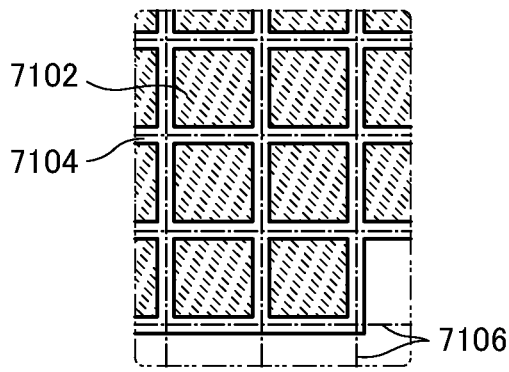

FIG. 24B is a top view illustrating a semiconductor wafer 7100 before a dicing process. FIG. 24C is an enlarged view of part of FIG. 24B. A plurality of circuit regions 7102 are provided in the semiconductor wafer 7100. For example, a semiconductor device of an embodiment of the present invention is provided in the circuit region 7102.

Figure 24D:
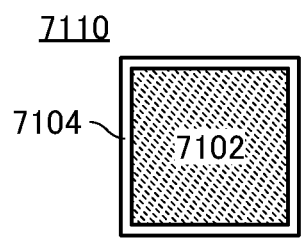

The plurality of circuit regions 7102 are each surrounded by a separation region 7104. Separation lines (also referred to as "dicing lines") 7106 are set at a position overlapping with the separation regions 7104. In the dicing step ST72, the semiconductor wafer 7100 is cut along the separation lines 7106, whereby chips 7110 including the circuit regions 7102 are cut out from the semiconductor wafer 7100. FIG. 24D is an enlarged view of the chip 7110.

A conductive layer or a semiconductor layer may be provided in the separation regions 7104. Providing a conductive layer or a semiconductor layer in the separation regions 7104 relieves ESD that might be caused in the dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation regions 7104 allows a reduction in the usage of the pure water. Therefore, the cost of manufacturing semiconductor devices can be reduced. Furthermore, productivity of the semiconductor device can be increased.

After Step ST72 is performed, the divided chips are separately picked up to be mounted on and bonded to a lead frame in a die bonding step (Step ST73). As a method for bonding the chip to the lead frame in the die bonding step, a method suitable for the product may be selected. For example, the bonding may be performed with a resin or a tape. In the die bonding step, the chip may be mounted on and bonded to an interposer. In a wire bonding step, a lead of the lead frame and an electrode on the chip are electrically connected to each other with a metal fine line (wire) (Step ST74). A silver line or a gold line can be used as the metal fine line. Either ball bonding or wedge bonding may be used as the wire bonding.

A molding step is performed to seal the wire bonded chip with an epoxy resin or the like (Step ST75). With the molding step, the inside of the electronic component is filled with the resin, so that damage to a mounted circuit portion or wire due to mechanical external force can be reduced. Furthermore, degradation in characteristics due to moisture or dust can be reduced. The lead of the lead frame is plated. After that, the lead is cut and processed (Step ST76). This plating step prevents rust of the lead, and soldering at the time of mounting the electronic component on a printed circuit board in a later step can be performed with higher reliability. Printing (marking) is performed on a surface of the package (Step ST77). Through an inspection step (Step ST78), the electronic component is completed (Step ST79).

Figure 24E:
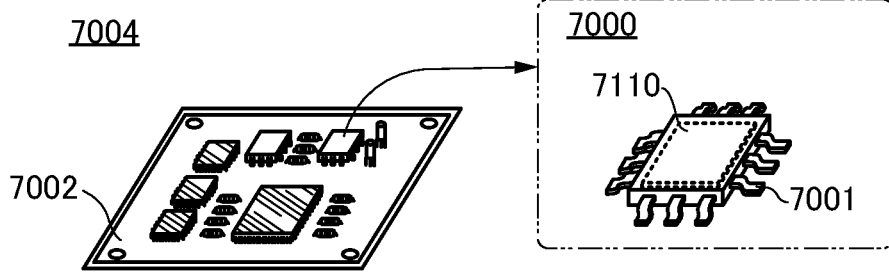

FIG. 24E is a schematic perspective view of the completed electronic component. FIG. 24E illustrates a schematic perspective view of a QFP (Quad Flat Package) as an example of the electronic component. As illustrated in FIG. 24E, an electronic component 7000 includes a lead 7001 and a chip 7110.

The electronic component 7000 is mounted on a printed circuit board 7002, for example. When a plurality of electronic components 7000 are used in combination and electrically connected to each other over the printed circuit board 7002, the electronic components 7000 can be mounted on an electronic device. A completed circuit board 7004 is provided in the electronic device or the like.

The electronic component 7000 can be used as an electronic component (IC chip) of electronic devices in a wide range of fields, such as digital signal processing, software-defined radio systems, avionics (electronic devices related to aviation, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), mobile phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

Examples of Application to Electronic Devices

Next, cases where the above-described electronic component is used for electronic devices such as a mobile object or a structure body or a housing will be described.

Figure 25A:
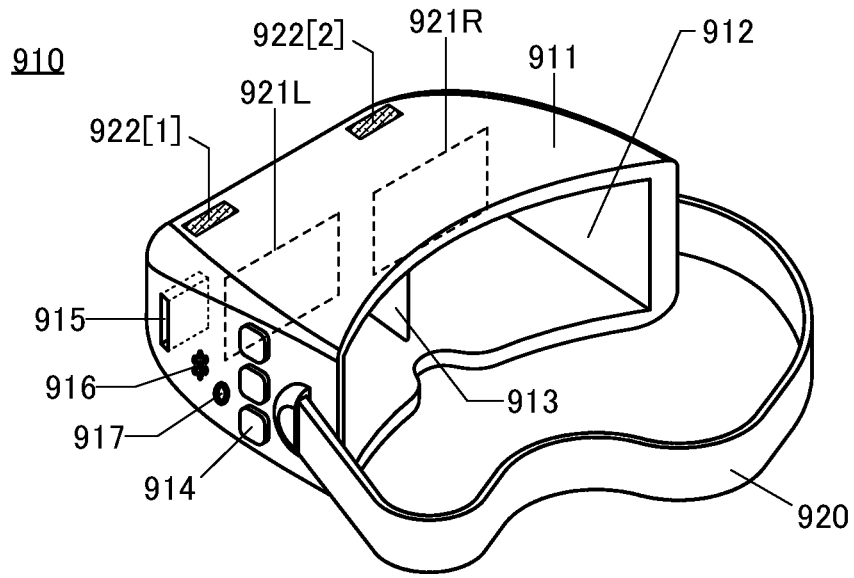
FIG. 25A and FIG. 25B are views illustrating structure examples of electronic devices.

FIG. 25A illustrates an HMD 910 (HMD: Head Mounted Display). An opening portion 912 is provided in part of a housing 911 in the HMD 910. Moreover, the HMD 910 includes a separator 913, an operation switch 914, an external memory means 915, a speaker 916, an acoustic external output terminal 917, a fixing unit 920, a display means 921 (a display means 921R and a display means 921L), and a sound-source detection device 922 (a sound-source detection device 922[1] and a sound-source detection device 922[2]).

As the sound-source detection device 922, the sound-source detection device 110 described in the above embodiment can be used. Furthermore, the HMD 910 is provided with the above-described electronic component having a function of the sound-source detection device 922 or the like.

A user of the HMD 910 puts the HMD 910 on the head to watch an image displayed on the display means 921. The sound-source detection device 922 provided in the HMD 910 can sense a change of the ambient environment while the user watches the image. In addition, it can generate a warning sound if necessary. Furthermore, it can display a warning on the display means 921 if necessary. Provision of the sound-source detection device 922 in the HMD 910 allows the user to concentrate on watching images with peace in mind and feel a stronger sense of immersion.

Figure 25B:
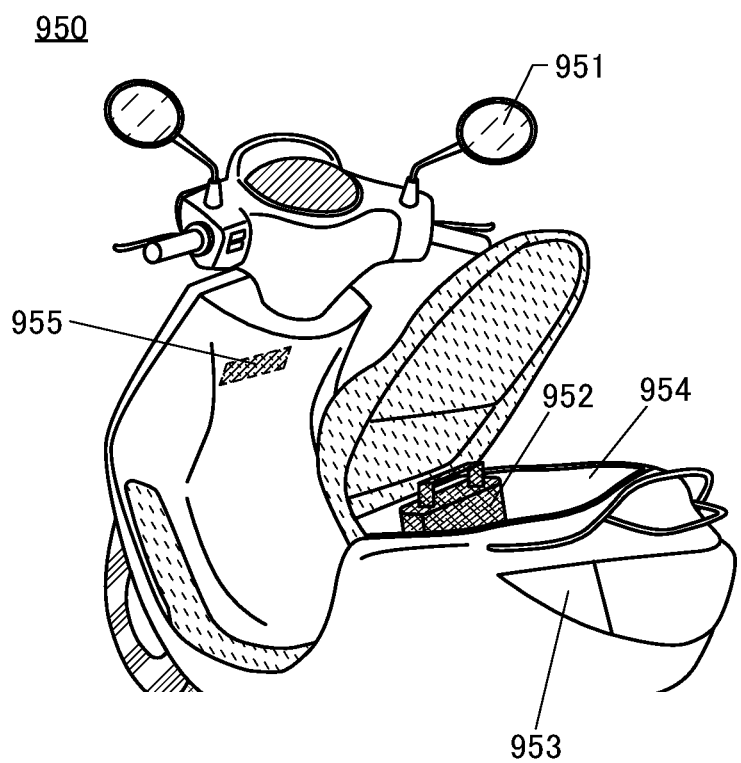

FIG. 25B illustrates a scooter 950. The scooter 950 includes a sideview mirror 951, a secondary battery 952, a direction indicator light 953, and a sound-source detection device 955. The secondary battery 952 is held in an under-seat storage 954.

As the sound-source detection device 955, the sound-source detection device 110 described in the above embodiment can be used. Furthermore, the scooter 950 is provided with the above-described electronic component having a function of the sound-source detection device 955 or the like. Provision of the sound-source detection device 955 in the scooter 950 can increase the driving safety.

This embodiment can be implemented in combination with the structures described in the other embodiments as appropriate.

Embodiment 5

Figure 26:
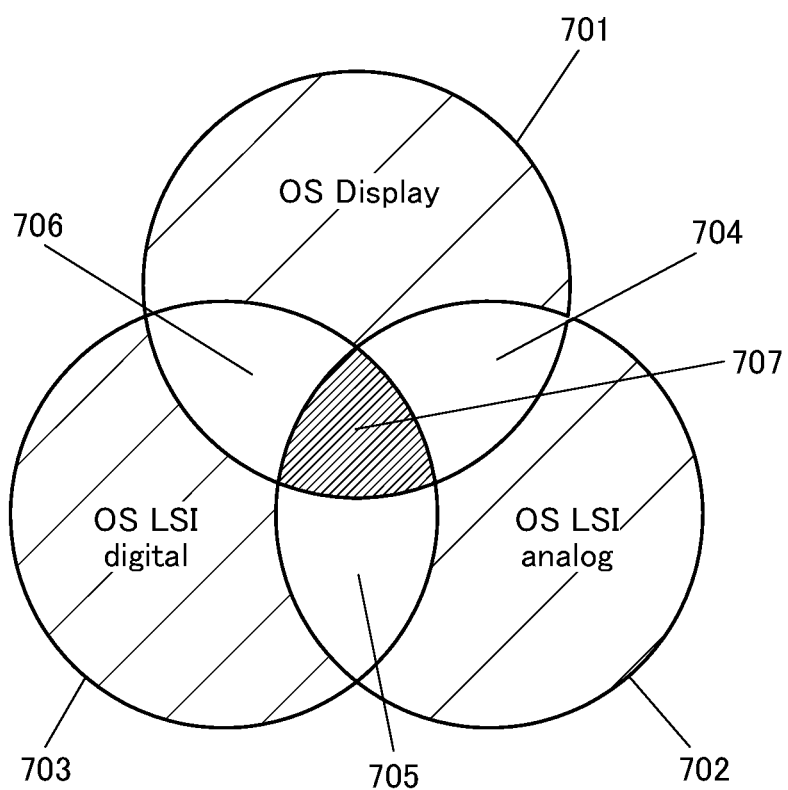
FIG. 26 is a view showing a market image.

In this embodiment, a market image where the OS transistor can be used will be described.
<Market Image>
FIG. 26 illustrates a market image where the OS transistor can be used. In FIG. 26, a region 701 represents a product field (OS Display) applicable to a display using an OS transistor; a region 702 represents a product field (OS LSI analog) where an LSI (Large Scale Integration) using an OS transistor can be applied to analog processing; and a region 703 represents a product field (OS LSI digital) where an LSI using an OS transistor can be applied to digital processing. The OS transistor can be favorably used in the three regions: the region 701, the region 702, and the region 703 illustrated in FIG. 26, in other words, three big markets.

In FIG. 26, a region 704 represents a region where the region 701 and the region 702 overlap with each other; a region 705 represents a region where the region 702 and the region 703 overlap with each other; a region 706 represents a region where the region 701 and the region 703 overlap with each other; and a region 707 represents a region where the region 701, the region 702, and the region 703 overlap with one another.

In OS Display, an FET structure such as a bottom-gate OS FET (BG OSFET) or a top-gate OS FET (TG OS FET) can be favorably used. Note that the bottom-gate OS FET includes a channel-etched FET and a channel-protective FET. In addition, the top-gate OS FET includes a TGSA (Top Gate Self-Aligned) FET.

In OS LSI analog and OS LSI digital, a gate-last OS FET (GL OS FET) can be favorably used, for example.

Note that the above-described transistors each include a single-gate transistor with one gate electrode, a dual-gate transistor with two gate electrodes, or a transistor with three or more gate electrodes. Among dual-gate transistors, it is particularly preferable to use an S-channel (surrounded channel) transistor.

Note that in this specification and the like, an S-channel transistor refers to a transistor with a structure in which a channel formation region is electrically surrounded by the electric fields of one of a pair of gate electrodes and the other thereof. Furthermore, in this specification and the like, the surrounded channel (S-channel) structure has a feature in that the side surface and the vicinity of the oxide 530 in contact with the conductor 542a and the conductor 542b functioning as a source electrode and a drain electrode are of I-type like the channel formation region. The side surface and the vicinity of the oxide 530 in contact with the conductor 542a and the conductor 542b are in contact with the insulator 544 and thus can be of I-type like the channel formation region. Note that in this specification and the like, "I-type" can be equated with "highly purified intrinsic" described above. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

As products included in OS display (the region 701), products in which an LCD (liquid crystal display), EL (Electro Luminescence), and an LED (Light Emitting Diode) are included as display devices can be given. Any of the above display devices is favorably combined with Q-Dot (Quantum Dot).

Note that in this embodiment, EL includes organic EL and inorganic EL. In addition, in this embodiment, LED includes a micro LED, a mini LED, and a macro LED. Note that in this specification and the like, a light-emitting diode with a chip size of 10000 $\mu m^2$ or less is referred to as a micro LED, a light-emitting diode with a chip size of greater than 10000 $\mu m^2$ and less than or equal to 1 $mm^2$ is referred to as a mini LED, and a light-emitting diode with a chip size of greater than 1 mm² is referred to as a macro LED, in some cases.

As products included in OS LSI analog (the region 702), a sound-source localization device that covers a wide frequency range (e.g., an audible sound with a frequency of 20 Hz to 20 kHz or ultrasonic wave of 20 kHz or greater), a battery control device (a battery control IC, a battery protection IC, or a battery management system), and the like can be given.

As products included in OS LSI digital (the region 703), a memory device, a CPU (Central Processing Unit) device, a GPU (Graphics Processing Unit) device, an FPGA (field-programmable gate array) device, a power device, a hybrid device in which an OS LSI and an Si LSI are stacked or mixed, a light-emitting device, and the like can be given.

As products included in the region 704, a display device including an infrared ray sensor or a near-infrared ray sensor in a display region, a sensor-equipped signal processing device including an OS FET, an implantable biosensor device, and the like can be given. As products included in the region 705, a processing circuit including an A/D (Analog to Digital) conversion circuit or the like, an AI (Artificial Intelligence) device including the processing circuit, and the like can be given. As products included in the region 706, a display device using a Pixel AI technology can be given, for example. Note that in this specification and the like, the Pixel AI technology refers to a technology utilizing a memory composed of an OS FET or the like included in a pixel circuit of a display.

As a product included in the region 707, a composite that combines a variety of products included in the region 701 to the region 706 can be given.

As described above, the semiconductor device of one embodiment of the present invention can be applied to a variety of product fields, as illustrated in FIG. 26. That is, the semiconductor device of one embodiment of the present invention can be applied to many markets.

This embodiment can be implemented in combination with the structures described in the other embodiments as appropriate.

REFERENCE NUMERALS

100: vehicle, 101: transistor, 102: transistor, 103: transistor, 104: transistor, 108: air bag, 110: sound-source detection device, 111: microphone array, 112: delay circuit group, 113: signal processing circuit, 114: ADC, 115: digital arithmetic circuit, 116: microphone, 117: delay circuit, 120: control device, 121: memory device, 122: arithmetic device, 123: neural network, 124: neuron, 130: signal output device, 131: air bag device, 132: air bag device, 133*a*: air bag device, 133*b*: air bag device, 134*a*: air bag device, 134*b*: air bag device, 140: sensor, 151: steering, 152: dashboard, 200: vehicle alarm device

The invention claimed is:

1. A vehicle alarm device comprising a sound-source detection device, a control device, and a signal output device,
   wherein the sound-source detection device is configured to obtain an extraneous sound and is configured to identify a sound-source position of the extraneous sound,
   wherein the control device is configured to obtain a change of the sound-source position and is configured to supply a signal to the signal output device,
   wherein the signal output device is configured to receive the signal and outputting an acoustic signal,
   wherein the sound-source detection device comprises:
   a microphone array comprising a first microphone and a second microphone;
   a first selection circuit; a first signal retention circuit; a second signal retention circuit; a second selection circuit; and
   a signal processing circuit,
   wherein the first selection circuit is configured to select the first microphone or the second microphone,
   wherein the first signal retention circuit is configured to retain sound-source signals obtained at a plurality of timings with the first microphone as a plurality of first voltages corresponding to the respective sound-source signals,
   wherein the second signal retention circuit is configured to retain sound-source signals obtained at a plurality of timings with the second microphone as a plurality of second voltages corresponding to the respective sound-source signals,
   wherein the second selection circuit is configured to select any one of the plurality of first voltages and any one of the plurality of second voltages,
   wherein the signal processing circuit is configured to perform an operation with the first voltage and the second voltage which are selected by the second selection circuit,
   wherein the first signal retention circuit and the second signal retention circuit each comprise a first transistor, and
   wherein a semiconductor layer of the first transistor comprises an oxide semiconductor.

2. The vehicle alarm device according to claim 1, wherein the acoustic signal is a signal which calls attention of a vehicle occupant.

3. The vehicle alarm device according to claim 1, wherein the control device has a function of obtaining the change of the sound-source position with the sound-source position and a relative velocity between the sound-source position and a vehicle.

4. The vehicle alarm device according to claim 1, further comprising a neural network.

5. The vehicle alarm device according to claim 1,
   wherein the first signal retention circuit and the second signal retention circuit each comprise a second transistor, and
   wherein a semiconductor layer of the second transistor comprises an oxide semiconductor.

6. The vehicle alarm device according to claim 1, wherein the signal processing circuit is a differential circuit or a multiplier circuit.

* * * * *